(12) United States Patent
Onuki et al.

(10) Patent No.: US 10,037,294 B2
(45) Date of Patent: Jul. 31, 2018

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Tatsuya Onuki, Kanagawa (JP); Wataru Uesugi, Saitama (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/590,406

(22) Filed: May 9, 2017

(65) Prior Publication Data

US 2017/0337149 A1    Nov. 23, 2017

(30) Foreign Application Priority Data

May 20, 2016  (JP) ................................. 2016-101535

(51) Int. Cl.
*G11C 11/4091*  (2006.01)
*G06F 13/40*  (2006.01)
(Continued)

(52) U.S. Cl.
CPC .......... *G06F 13/40* (2013.01); *G06F 12/0246* (2013.01); *G06F 12/0831* (2013.01);
(Continued)

(58) Field of Classification Search
CPC ................................................ G11C 11/4091
(Continued)

(56) References Cited

U.S. PATENT DOCUMENTS 8,508,967 B2   8/2013   Yamazaki et al.
8,837,203 B2   9/2014   Shionoiri et al.
(Continued)

FOREIGN PATENT DOCUMENTS

JP    2012-256820 A    12/2012
WO   WO-2015/155635    10/2015

OTHER PUBLICATIONS

Yakubo.Y et al., "High-speed and Low-leakage Characteristics of 60-nm C-axis Aligned Crystalline Oxide Semiconductor FET with GHz-ordered Cutoff Frequency", SSDM 2014 (Extended Abstracts of the 2014 International Conference on Solid State Devices and Materials), Sep. 8 2014, pp. 648-649.
(Continued)

*Primary Examiner* — Jason Lappas
(74) *Attorney, Agent, or Firm* — Fish & Richardson P.C.

(57) ABSTRACT

A semiconductor device including a memory which can perform a pipeline operation is provided. The semiconductor device includes a processor core, a bus, and a memory section. The memory section includes a first memory. The first memory includes a plurality of local arrays. The local array includes a sense amplifier array and a local cell array stacked thereover. The local cell array is provided a memory cell including one transistor and one capacitor. The transistor is preferably an oxide semiconductor transistor. The first memory is configured to generate a wait signal. The wait signal is generated when a request for writing data to the same local array is received over two successive clock cycles from the processor core. The wait signal is sent to the processor core via the bus. The processor core stands by for a request for the memory section on the basis of the wait signal.

18 Claims, 16 Drawing Sheets

(51) Int. Cl.

| | | |
|---|---|---|
| *G11C 15/04* | (2006.01) | |
| *G06F 13/10* | (2006.01) | |
| *G06F 13/42* | (2006.01) | |
| *G06F 15/80* | (2006.01) | |
| *G06F 12/02* | (2006.01) | |
| *G06F 12/0831* | (2016.01) | |
| *G11C 14/00* | (2006.01) | |

(52) U.S. Cl.
CPC .......... *G06F 13/10* (2013.01); *G06F 13/4256* (2013.01); *G06F 15/80* (2013.01); *G11C 15/04* (2013.01); *G11C 11/4091* (2013.01); *G11C 14/0027* (2013.01); *G11C 14/0036* (2013.01); *G11C 14/0054* (2013.01); *G11C 14/0072* (2013.01); *G11C 14/0081* (2013.01)

(58) Field of Classification Search
USPC .......................................................... 365/72
See application file for complete search history.

(56) References Cited

U.S. PATENT DOCUMENTS

| | | | |
|---|---|---|---|
| 9,230,615 B2 | 1/2016 | Takemura | |
| 9,245,593 B2 | 1/2016 | Ishizu | |
| 9,336,850 B2 | 5/2016 | Shionoiri et al. | |
| 9,478,276 B2 | 10/2016 | Onuki | |
| 9,542,977 B2 | 1/2017 | Onuki et al. | |
| 9,627,034 B2 | 4/2017 | Matsuzaki | |
| 9,704,562 B2 | 7/2017 | Onuki et al. | |
| 9,728,243 B2 | 8/2017 | Kato | |
| 9,741,400 B2 | 8/2017 | Nagatsuka et al. | |
| 2013/0155790 A1 | 6/2013 | Atsumi | |
| 2015/0325282 A1 | 11/2015 | Kato et al. | |
| 2016/0006433 A1 | 1/2016 | Ishizu et al. | |
| 2016/0104521 A1* | 4/2016 | Onuki | G11C 11/4091 365/72 |
| 2017/0013214 A1 | 1/2017 | Ohmaru | |
| 2017/0033109 A1 | 2/2017 | Yamazaki | |
| 2017/0033111 A1 | 2/2017 | Yamazaki et al. | |
| 2017/0040048 A1 | 2/2017 | Onuki | |
| 2017/0133064 A1 | 5/2017 | Nagatsuka et al. | |
| 2017/0221899 A1 | 8/2017 | Uesugi et al. | |

OTHER PUBLICATIONS

Onuki.T et al., "DRAM with Storage Capacitance of 3.9 tF using CAAC-OS Transistor with L of 60 nm and having More Than 1-h Retention Characteristics", SSDM 2014 (Extended Abstracts of the 2014 International Conference on Solid State Devices and Materials), Sep. 8, 2014, pp. 430-431.

Matsuzaki.T et al., "A 128kb 4b/cell Nonvolatile Memory with Crystalline In—Ga—Zn Oxide FET Using Vt Cancel White Method", ISSCC 2015 (Digest of Technical Papers. IEEE International Solid-State Circuits Conference), Feb. 22, 2015, pp. 306-308.

\* cited by examiner

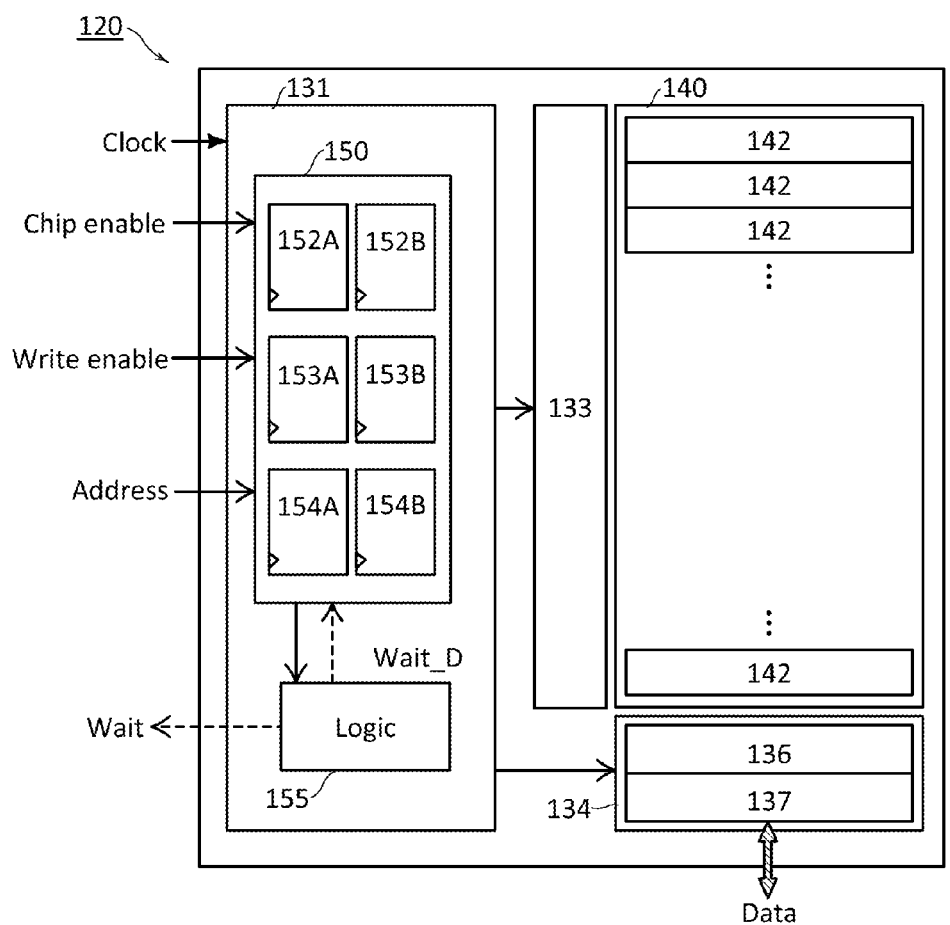

- (ST71) rear-surface grinding
- (ST72) dicing
- (ST73) die bonding
- (ST74) wire bonding
- (ST75) molding
- (ST76) lead plating
- (ST77) formation
- (ST78) marking
- (ST79) testing FIG. 15A
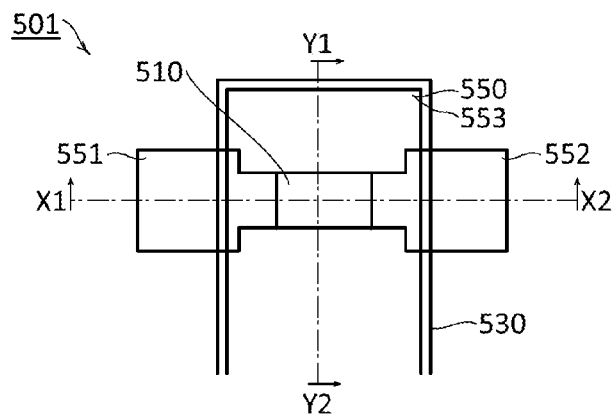
FIG. 15B
FIG. 15C
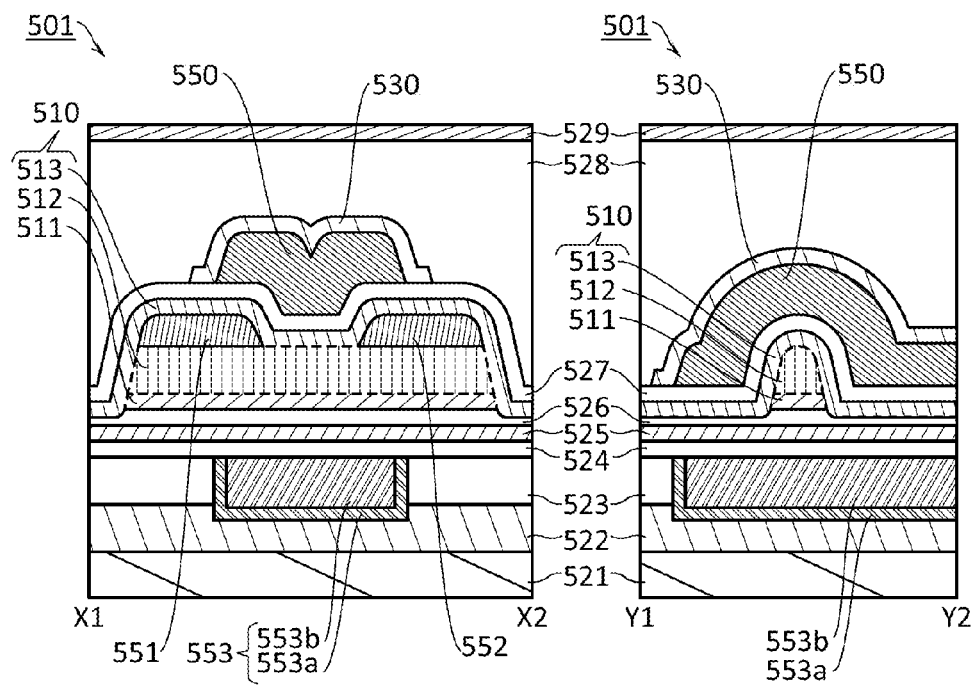

SEMICONDUCTOR DEVICE, ELECTRONIC COMPONENT, AND ELECTRONIC DEVICE

BACKGROUND OF THE INVENTION

1. Field of the Invention

One embodiment of the present invention disclosed in the specification, drawings, and scope of claims of this application (hereinafter referred to as this specification and the like) relates to a semiconductor device, an operation method thereof, a usage method thereof, a manufacturing method thereof, and the like. Note that one embodiment of the present invention is not limited to the above technical field.

2. Description of the Related Art

Dynamic random access memories (DRAMs) are widely used as typical memories. A general DRAM cell is composed of one transistor (1T) and one capacitor (1C). A DRAM is a memory capable of retaining data by accumulating electric charge in a capacitor and thus has no limit on the number of times of writing in principle. As a high-capacity memory, the DRAM is incorporated in a number of electronic devices because of writing and reading at high speed and a small number of elements in cells, which easily enable high integration.

A transistor including a metal oxide in a channel formation region (hereinafter, such a transistor may be referred to as an oxide semiconductor transistor or an OS transistor) is known. A 1T1C DRAM in which a cell is formed using an OS transistor is proposed (e.g., Patent Documents 1 and 2 and Non-Patent Document 1).

In this specification and the like, a memory which is provided with an OS transistor in a memory cell is referred to as an OS memory. Of OS memories, a DRAM with a 1T1C cell is referred to as an oxide semiconductor DRAM or a dynamic oxide semiconductor RAM (DOSRAM, which is a registered trademark).

REFERENCE

Patent Document

[Patent Document 1] Japanese Published Patent Application No. 2012-256820
[Patent Document 2] International Publication WO2015/155635

Non-Patent Document

[Non-Patent Document 1] T. Onuki et al., "DRAM with Storage Capacitance of 3.9 fF using CAAC-OS Transistor with L of 60 nm and having more than 1-h Retention Characteristics," Ext. Abstr. Solid-State Devices and Materials, 2014, pp. 430-431.

SUMMARY OF THE INVENTION

An object of one embodiment of the present invention is to provide a novel semiconductor device including a DOSRAM, an operation method thereof, and usage thereof.

Objects of embodiments of the present invention are to enable a pipeline operation, to improve throughput, to reduce the number of clock cycles in a stall state, to achieve larger capacitance of a memory section, and to provide a semiconductor device with low power consumption.

One embodiment of the present invention does not necessarily achieve all the objects described above. The description of a plurality of objects does not preclude their coexistence. Other objects will be apparent from the description of this specification and the like, and such objects could be objects of one embodiment of the present invention.

(1) One embodiment of the present invention is a semiconductor device including a processor core, a memory section, and a bus. Signals and data are transmitted between the processor core and the memory section via the bus. The memory section includes a first memory. The first memory includes first to $M_0$th ($M_0$ is an integer of more than 1) local arrays. A jth (j is an integer of 1 to $M_0$) local array includes a jth sense amplifier array and a jth local cell array. The jth local cell array is provided over the jth sense amplifier array. The jth local cell array includes first to ($M_1 \times N$)th ($M_1$ and N are each an integer of 1 or more) bit line pairs. A memory cell includes a capacitor and a transistor that controls charging and discharging of the capacitor. The jth sense amplifier array includes first to ($M_1 \times N$)th sense amplifiers. A hth (h is an integer of 1 to $M_1 \times N$) bit line pair is electrically connected to an hth sense amplifier. The first memory is configured to generate a wait signal when the first memory receives a request for writing data to the jth local array over two successive clock cycles from the processor core. The processor core is configured to stand by for a request for the memory section on the basis of the wait signal.

(2) In the embodiment (1), the first memory is configured to drive the first to Moth local arrays on the basis of the wait signal.

(3) In the embodiment (1) or (2), the number of memory cells for each bit line in the jth local cell array is $2^x$ (x is an integer of 2 to 7).

(4) In any one of the embodiments (1) to (3), a channel formation region of the transistor includes an oxide semiconductor.

(5) In any one of the embodiments (1) to (4), the first memory includes first to $M_1$th global bit line pairs, first to $M_1$th global sense amplifiers, and a multiplexer. An ith (i is an integer of 1 to $M_1$) global bit line pair is electrically connected to an ith global sense amplifier. The multiplexer is configured to select $M_1$ bit line pairs from the first to ($M_1 \times N$)th bit line pairs and to establish electrical continuity between the selected $M_1$ bit line pairs and the first to $M_1$th global bit line pairs.

(6) In the embodiment (5), the first to $M_1$th global bit line pairs are provided over the first to Moth local arrays.

(7) In any one of the embodiments (1) to (6), the memory section includes at least one of an SRAM, a flash memory, an ferroelectric RAM, a magnetoresistive RAM, a resistance RAM, and a phase change RAM.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a storage device, a display device, a light-emitting device, a lighting device, an imaging device, an electronic device, and the like themselves might be semiconductor devices, or might each include a semiconductor device.

In this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, each of X and Y denotes an object (e.g., a device, an element, a circuit, a wiring, an electrode, a terminal, a conductive film, or a layer).

Note that a transistor includes three terminals: a gate, a source, and a drain. A gate is a terminal that controls the conduction state of a transistor. Depending on the channel type of the transistor or levels of potentials applied to the terminals, one of two input/output terminals functions as a source and the other functions as a drain. Therefore, the terms "source" and "drain" can be replaced with each other in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit configuration, a device structure, and the like. Furthermore, a terminal, a wiring, or the like can be referred to as a node.

A voltage usually refers to a potential difference between a given potential and a reference potential (e.g., a ground potential or a source potential). Thus, a voltage can be referred to as a potential and vice versa. Note that the potential indicates a relative value. Accordingly, "ground potential" does not necessarily mean 0 V.

In this specification and the like, the terms "film" and "layer" can be interchanged depending on the case or circumstances. For example, in some cases, the term "conductive film" can be used instead of the term "conductive layer", and the term "insulating layer" can be used instead of the term "insulating film".

In this specification and the like, ordinal numbers such as "first," "second," and "third" are used to avoid confusion among components, and thus do not limit the number of components or do not limit the order.

According to one embodiment of the present invention, it is possible to provide a novel semiconductor device including a DOSRAM, an operation method thereof, and usage thereof.

According to one embodiment of the present invention, it is possible to enable a pipeline operation, to improve throughput, to reduce the number of clock cycles in a stall state, to achieve larger capacitance of a memory section, and to provide a semiconductor device with low power consumption.

In one embodiment of the present invention, there is no need to achieve all the effects described above. Note that the description of the plurality of effects does not disturb the existence of other effects. In one embodiment of the present invention, other objects, effects, and novel features will be apparent from the description of the specification and the drawings.

BRIEF DESCRIPTION OF THE DRAWINGS

FIG. 4 shows an operation example of a DOSRAM.

FIG. 5 is a block diagram illustrating a configuration example of a DOSRAM.

FIG. 15A is a plan view illustrating a structure example of an oxide semiconductor transistor, and FIGS. 15B and 15C are cross-sectional views of FIG. 15A.

DETAILED DESCRIPTION OF THE INVENTION

Figure 1:
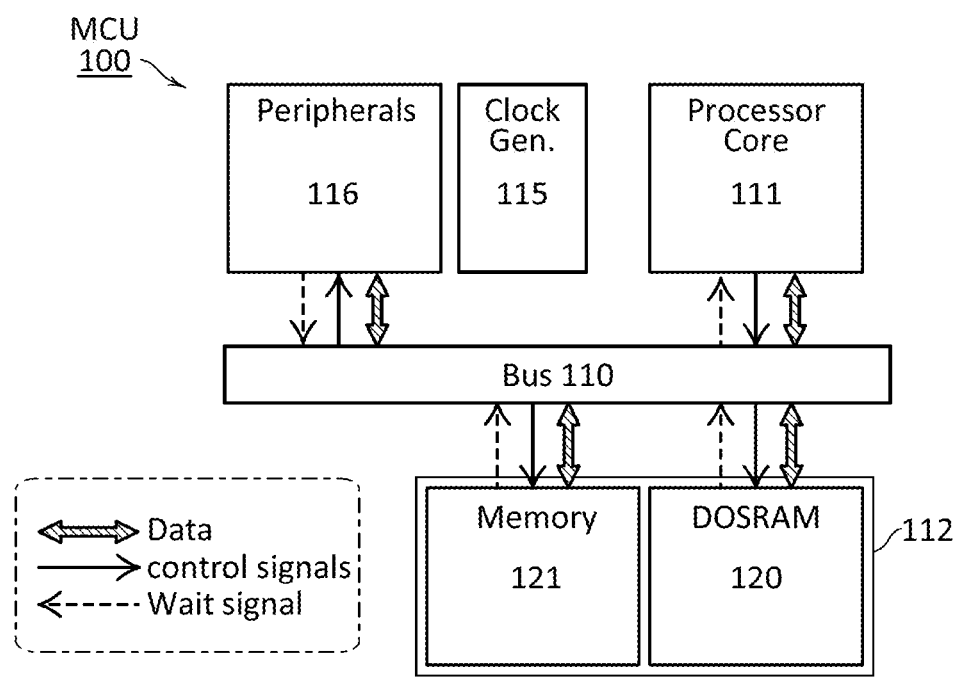
FIG. 1 is a block diagram illustrating a configuration example of a microcontroller unit (MCU).

Embodiments of the present invention will hereinafter be described. Note that any of the embodiments described in this specification can be combined as appropriate. In addition, in the case where a plurality of structure examples (including operation examples, usage examples, manufacturing method examples, and the like) are given in one embodiment, any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

In the drawings, the size, the layer thickness, the region, or the like is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relations of circuit blocks illustrated in a block diagram are specified for description; therefore, the positions of circuit blocks of one embodiment of the present invention are not limited thereto. Even when a diagram illustrates that different functions are achieved by different circuit blocks in a block diagram, one circuit block may be actually configured to achieve different functions. Functions of circuit blocks in a diagram are specified for description, and even when a diagram shows one circuit block performing given processing, a plurality of circuit blocks may be actually provided to perform the processing.

Embodiment 1

In this embodiment, a semiconductor device provided with an OS memory is described.

<<MCU>>

FIG. 1 illustrates a configuration example of a microcontroller unit (MCU). An MCU 100 illustrated in FIG. 1 includes a bus 110, a processor core 111 (hereinafter referred to as a core 111), a memory section 112, a clock generation circuit 115, and a peripheral circuit 116. The memory section 112 includes a DOSRAM 120 and a memory 121. The MCU 100 is a semiconductor device which is integrated into one chip.

The clock generation circuit 115 has a function of generating clock signals to be used in the MCU 100. There is no particular limitation of the function of the peripheral circuit 116. In the peripheral circuit 116, various functional circuits are provided in accordance with the use of the MCU 100. Examples of the functional circuits include a power supply circuit, a power supply management unit, a timer device, an interrupt controller, an input/output port, an analog-digital converter (ADC), a comparator, and an operational amplifier. In the case where the MCU 100 is used as a controller for a display device (also referred to as a display controller), an image processing circuit for processing image data, a timing controller for generating timing signals, and the like are provided in the peripheral circuit 116. In that case, the DOSRAM 120 of the memory section 112 can be used as a frame memory.

The memory section 112 includes the DOSRAM 120 and the memory 121. The memory 121 is any memory as long as it is rewritable, e.g., an SRAM, a flash memory, an ferroelectric RAM (FeRAM), a magnetoresistive RAM (MRAM), a resistance RAM (ReRAM), or a phase change RAM (PRAM).

The memory 121 is not necessarily provided in the memory section 112. A plurality of memories 121 may be provided in the memory section 112. For example, an SRAM and a flash memory may be provided in the memory section 112. A read-only memory (ROM) may be provided in the memory section 112.

The core 111 exchanges data with the memory section 112 and the peripheral circuit 116 via the bus 110. Control signals from the core 111 are input to the bus 110. The bus 110 sends control signals to a circuit block which is to be controlled. The control signals include an enable signal and an address signal.

The DOSRAM 120, the memory 121, and the peripheral circuit 116 each have a function of issuing wait signals. The wait signal is a signal for requiring the core 111 to delay access. The wait signal that has been input to the bus 110 is transmitted to the core 111.

<DOSRAM>

Figure 2A:
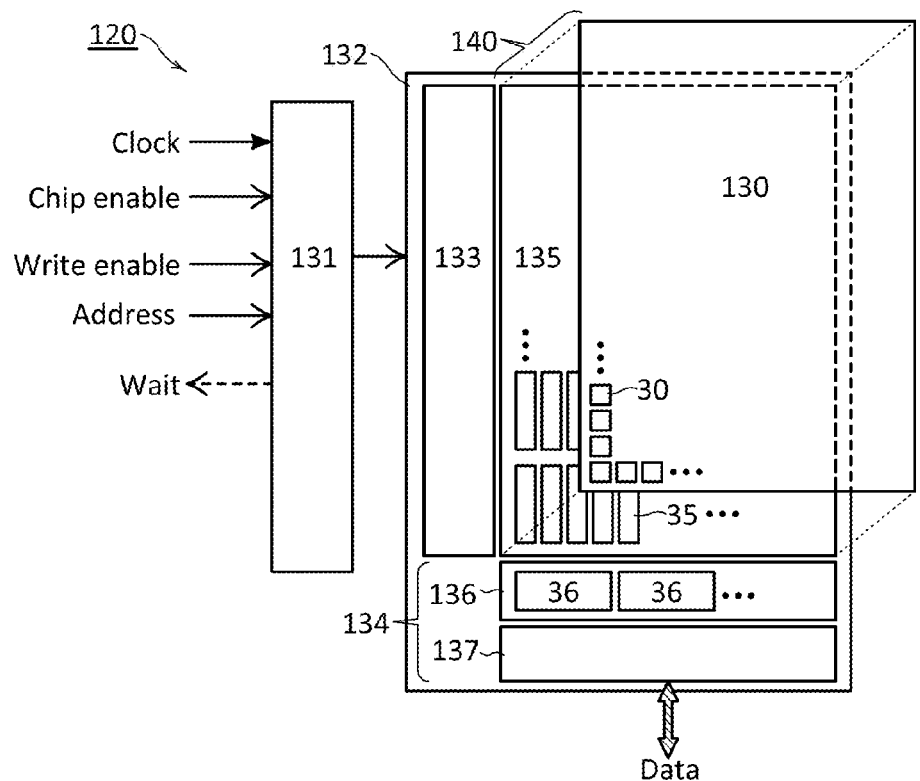
FIG. 2A is a block diagram illustrating a configuration example of a DOSRAM.

FIG. 2A is a block diagram illustrating a configuration example of the DOSRAM 120. The DOSRAM 120 includes a memory cell array 130, a control section 131, and a peripheral circuit 132. The peripheral circuit 132 includes a row circuit 133, a column circuit 134, and a sense amplifier block 135. The column circuit 134 includes a global sense amplifier block 136 and an input/output circuit 137.

The control section 131 has a function of controlling the entire operation of the DOSRAM 120. The control section 131 performs a logical operation on a chip enable signal and a write enable signal and determines whether access requested by the core 111 is write access or read access. The control section 131 generates a control signal for the peripheral circuit 132 on the basis of the logic operation. In addition, the control section 131 generates a wait signal on the basis of a chip enable signal, a write enable signal, and an address signal. The wait signal is sent to the bus 110 and then sent from the bus 110 to the memory section 112 or the like. When the core 111 receives the wait signal, it delays execution of access to the memory section 112.

Here, a write enable signal is generated by the core 111. A chip enable signal is generated by the bus 110. The bus 110 generates a chip enable signal on the basis of an address signal and a write enable signal which are output from the core 111.

Figure 2B:
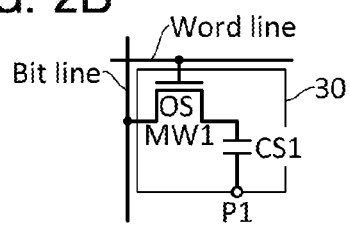
FIGS. 2B to 2D are each a circuit diagram illustrating a configuration example of a memory cell.

The memory cell array 130 includes a plurality of memory cells 30, a plurality of word lines, and a plurality of bit lines. The memory cells 30 are electrically connected to the bit lines and the word lines. FIG. 2B illustrates a configuration example of the memory cell 30.

The memory cell 30 includes a transistor MW1, a capacitor CS1, and a terminal P1. One of two terminals of the capacitor CS1 is electrically connected to the terminal P1, and the other thereof is electrically connected to a first terminal of the transistor MW1. A constant potential (e.g., a low power supply potential) is input to the terminal P1. A gate of the transistor MW1 is electrically connected to a word line, and a second terminal of the transistor MW1 is electrically connected to a bit line. The transistor MW1 has a function of controlling charging and discharging of the capacitor CS1. There is theoretically no limitation on the number of rewriting operations of the DOSRAM 120 because data are rewritten by charging and discharging of the capacitor; and data can be written/read to/from the DOSRAM 120 with low energy.

Here, the transistor MW1 is an OS transistor. An OS transistor is preferably used as the transistor in the memory cell 30 because of its extremely low off-state current. Owing to the extremely low off-state current of the transistor MW1, leakage of charge from the capacitor CS1 can be prevented. Accordingly, a retention time of the DOSRAM 120 is extremely longer than that of a DRAM. Therefore, the frequency of refresh can be reduced, whereby power needed for refresh operations can be reduced.

Here, an off-state current refers to a current that flows between a source and a drain of a transistor in an off state. In the case of an n-channel transistor, for example, when the threshold voltage of the transistor is approximately 0 V to 2

V, a current flowing between a source and a drain when a voltage between a gate and the source is negative can be referred to as an off-state current. An extremely low off-state current means, for example, that the off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

An oxide semiconductor has a bandgap of 2.5 eV or higher; thus, an OS transistor has a low leakage current due to thermal excitation and, as described above, has an extremely low off-state current. An oxide semiconductor used as a channel formation region of an OS transistor is preferably an oxide semiconductor containing at least one of indium (In) and zinc (Zn). Typical examples of such an oxide semiconductor include an In—M—Zn oxide (the element M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly-purified oxide semiconductor. By using a highly purified oxide semiconductor, the off-state current of the OS transistor which is normalized by the channel width can be as low as several yoctoamperes per micrometer to several zeptoamperes per micrometer. The OS transistor will be described in Embodiment 4.

Figure 2C:
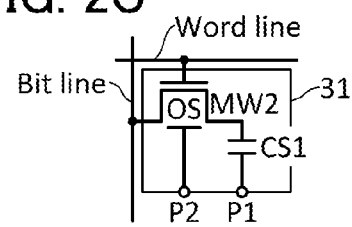
Figure 2D:
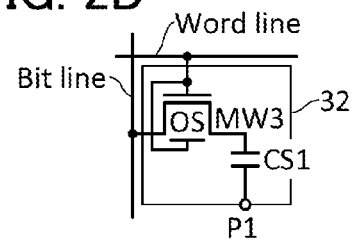

FIGS. 2C and 2D each illustrate a modification example of the memory cell 30. A memory cell 31 illustrated in FIG. 2C includes a transistor MW2 with a back gate instead of the transistor MW1, and includes a terminal P2. The back gate of the transistor MW2 is electrically connected to the terminal P2. The potential of the terminal P2 may be a fixed potential (e.g., a negative constant potential) or may change in response to operation of the DOSRAM 120, for example.

A memory cell 32 illustrated in FIG. 2D includes a transistor MW3 with a back gate instead of the transistor MW1. The back gate of the transistor MW3 is electrically connected to a gate thereof. The back gate of the transistor MW3 may be electrically connected to a source or a drain thereof.

The row circuit 133 has a function of driving the word lines and driving the sense amplifier block 135.

The sense amplifier block 135 includes a plurality of sense amplifiers 35. A bit line pair is electrically connected to the sense amplifier 35. The sense amplifier 35 has a function of precharging the bit line pair, amplifying a difference between the potentials of the bit line pair, and retaining the potential difference. The sense amplifier block 135 is electrically connected to the global sense amplifier block 136 via a plurality of global bit line pairs. The plurality of global bit line pairs is provided in a memory cell block 140.

The global sense amplifier block 136 includes a plurality of global sense amplifiers 36. The global sense amplifier block 136 has a function of amplifying differences between potentials of the global bit line pairs and a function of retaining the potential differences.

The input/output circuit 137 has a function of inputting write data to the plurality of global bit line pairs and a function of outputting output potentials of the global sense amplifiers 36, as read data, to the outside.

<Memory Cell Block>

Stacking the memory cell array 130 over the sense amplifier block 135 facilitates increase in capacity. Here, a circuit block including the sense amplifier block 135 and the memory cell array 130 is referred to as the memory cell block 140. The DOSRAM 120 employs a hierarchical bit-line architecture with hierarchical local bit lines and global bit lines. Therefore, the memory cell block 140 can be divided into a plurality of call arrays. The hierarchical bit-line architecture of the DOSRAM 120 is described below with reference to FIGS. 3A and 3B.

Figure 3A:
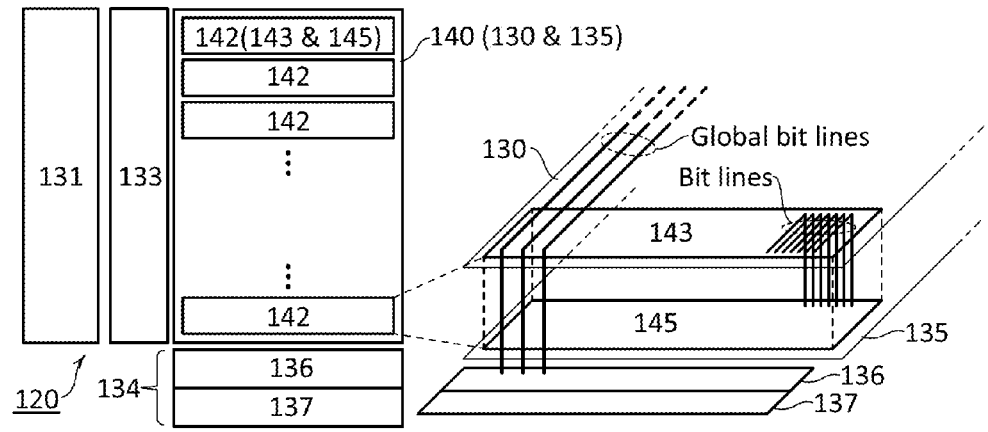
FIG. 3A is a block diagram illustrating a configuration example of a DOSRAM.

Global bit lines are stacked over the memory cell array 130 as illustrated in FIG. 3A. The memory cell block 140 includes a plurality of local arrays 142 arranged in a row direction. The local array 142 includes a local cell array 143 and a sense amplifier array 145. The local cell array 143 is provided in the memory cell array 130, and the sense amplifier array 145 is provided in the sense amplifier block 135. Although FIG. 3A illustrates the example in which where the local cell array 143 has a folded bit-line architecture, the local cell array 143 may have an open bit-line architecture.

Figure 3B:
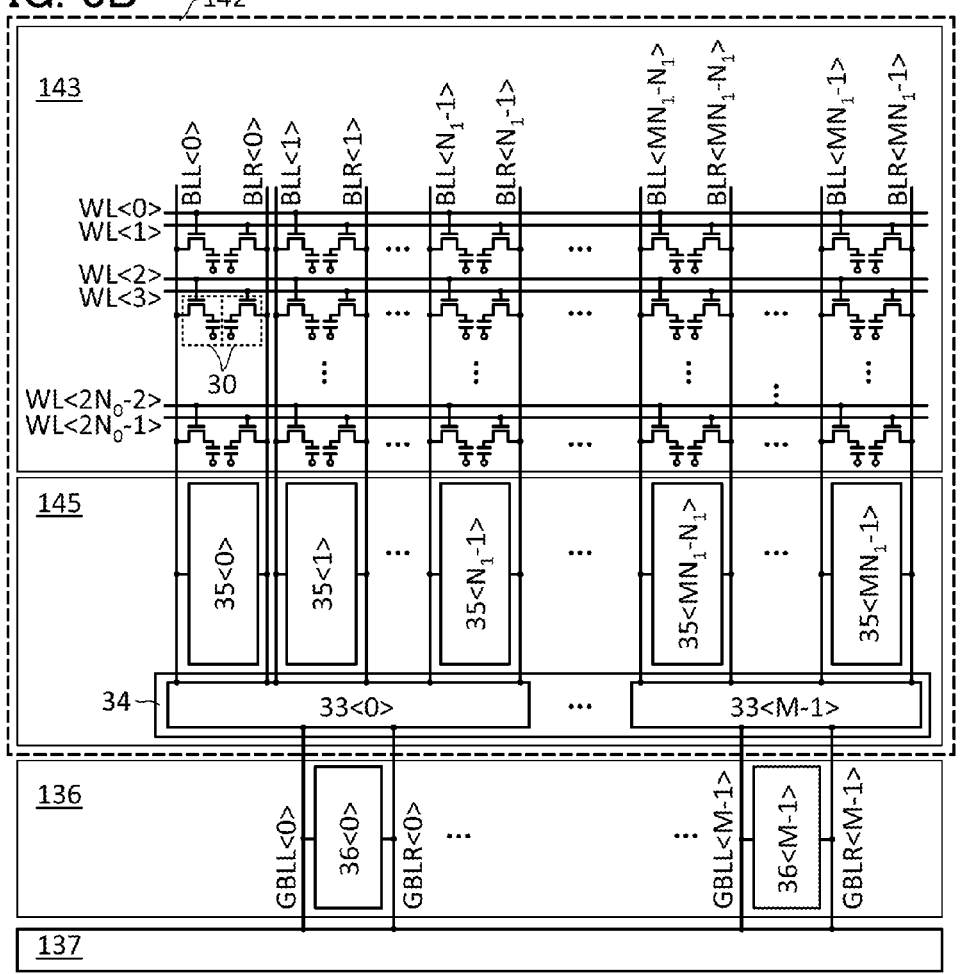
FIG. 3B is a block diagram illustrating a configuration example of a local array and a global sense amplifier block.

A configuration example of the local array 142 and the global sense amplifier block 136 is described with reference to FIG. 3B. In the memory cell array 130, the number of the global bit lines is 2M (M is an integer of 1 or more). In the local array 142, the number of memory cells per bit line is $N_0$ ($N_0$ is an integer of 2 or more), the number of word lines is $2N_0$, and the number of bit lines is $2MN_1$ ($N_1$ is an integer of 1 or more).

The local array 142 includes word lines WL<0> to WL<$2N_0$-1>, bit lines BLL<0> to BLL<$MN_1$-1>, and bit lines BLR<0> to BLR<$MN_1$-1>. The sense amplifier array 145 includes sense amplifiers 35<0> to 35<$MN_1$-1> and a multiplexer (MUX) 34. The multiplexer (MUX) 34 includes selectors 33<0> to 33<M-1>. The global sense amplifier block 136 includes global sense amplifiers 36<0> to 36<M-1>.

Here, a bit line pair refers to two bit lines which are compared by a sense amplifier at the same time. A global bit line pair refers to two global bit lines which are compared by a global sense amplifier at the same time. A bit line pair can be referred to as a pair of bit lines, and a global bit line pair can be referred to as a pair of global bit lines. In the example in FIG. 3B, the bit line BLL and the bit line BLR correspond to a pair of bit lines. A pair of bit lines is also referred to as a bit line pair (BLL,BLR). The same applies to a global bit line pair.

The sense amplifier 35<j> (j is an integer of 0 to $MN_1$-1) is electrically connected to a bit line pair (BLL<j>,BLR<j>). The sense amplifier 35<j> has a function of amplifying a potential difference between the bit line BLL<j> and the bit line BLR<j> and a function of retaining the potential difference.

The global sense amplifier 36<i> (i is an integer of 0 to M-1) is electrically connected to a global bit line pair (GBLL<i>,GBLR<i>). The global sense amplifier 36<i> has a function of amplifying a potential difference between the global bit line GBLL<i> and the global bit line GBLR<i> and a function of retaining the potential difference. The input/output circuit 137 writes and reads data to and from the global bit lines GBLL<i> and GBLR<i>.

The MUX 34 has a function of electrically connecting M bit line pairs (BLL,BLR) of $MN_1$ bit line pairs to M global bit line pairs (GBLL,GBLR). The global bit line pair (GBLL<i>,GBLR<i>) and $N_1$ bit line pairs (BLL<i$N_1$>, BLR<i$N_1$>) to (BLL<(i+1)$N_1$-1>,BLR<(i+1)$N_1$-1>) are electrically connected to the selector 33<i>. The selector 33<i> has a function of selecting one of the N₁ bit line pairs (BLL,BLR) and establishing electrical continuity between the selected bit line pair (BLL,BLR) and the global bit line pair (GBLL<i>,GBLR<i>).

Note that when the number of the global sense amplifiers 36 is the same as the number of the bit line pairs (BLL,BLR), the MUX 34 is not necessarily provided in the sense amplifier array 145, and a multiplexer which has the same function as the MUX 34 is provided in the column circuit 134.

Since the memory cell block 140 has a stacked-layer structure as illustrated in FIG. 3A, the length of the bit line can be as short as the length of the sense amplifier array 145. Shortening the bit line can reduce the bit line capacitance, so that the storage capacitance of the memory cell 30 can be reduced. In addition, the MUX 34 is provided in the sense amplifier array 145, whereby the number of the long bit lines can be reduced. For the above reasons, drive load during access to the DOSRAM 120 can be reduced; as a result, energy consumed by the MCU 100 can be reduced.

An outline of a write operation of the DOSRAM 120 is described. The input/output circuit 137 writes data to the global bit line pair (GBLL,GBLR). The data of the global bit line pair (GBLL,GBLR) are retained by the global sense amplifier block 136. The MUX 34 of the local array 142 assigned by an address establishes electrical continuity between the M global bit line pairs (GBLL,GBLR) and the M bit line pairs (BLL,BLR) of the local array 142. The retention data of the global sense amplifier block 136 are written to the M bit line pairs (BLL,BLR). The sense amplifier array 145 amplifies and retains the written data. The row circuit 133 selects a word line WL of a row assigned by the address. Data of the bit line BLL or the bit line BLR are written to the memory cells 30 of the selected row.

The outline of a read operation of the DOSRAM 120 is described. A word line WL of a row assigned by an address is brought into a selected state, whereby data of the local cell array 143 are written to the bit line pairs (BLL,BLR). The sense amplifier array 145 stores data of the bit line pairs (BLL,BLR) in the individual sense amplifiers 35. Data of a column assigned by the address of the retention data of the sense amplifier array 145 are written to the global bit line pair (GBLL,GBLR) by the MUX 34. The global sense amplifier block 136 detects and retains the data of the global bit line pair (GBLL,GBLR). The retention data of the global sense amplifier block 136 are output to the input/output circuit 137. Thus, the read operation is completed.

When a read operation is performed, data in a row from which data are read are corrupted because of the structure of the memory cell 30. Therefore, a data restoration operation needs to be performed after the read operation. The data restoration operation is an operation for writing the data of the sense amplifier array 145 back to the local cell array 143. The word line WL of the row from which data is read is brought into a selected state again, whereby the data of the sense amplifier array 145 are written back to the local cell array 143.

<Pipeline Processing of DOSRAM>

The memory cell block 140 can be operated by operating individual local arrays 142. The data restoration can be performed only by operating a target local array 142, and the global sense amplifier block 136 does not need to operate. Therefore, during the data restoration operation, data can be written or read to/from another local array 142. That is, the plurality of local arrays 142 enables the DOSRAM 120 to perform a pipeline operation.

FIG. 4 shows an example of the pipeline operation of the DOSRAM 120. CY0 and the like represent clock cycles. Four of the local arrays 142, which are called local arrays A, B, C, and D, are described here. The DOSRAM 120 performs a write operation or a read operation in accordance with an access request from the bus 110. In a clock cycle CY0, data are written to the local array A. In the clock cycle CY0, data cannot be written nor read to/from the local arrays B to D. In the next clock cycle CY1, data can be written or read to/from one of the local arrays A to D. In this example, data are read from the local array D.

In a clock cycle CY2, the local array D performs a restoration operation. In the clock cycle CY2, a read operation or a write operation can be performed in one of the local arrays A to C. Here, a read operation is performed in the local array C. In a clock cycle CY3, a restoration operation is performed in the local array C, and a write operation is performed in the local array B.

As shown in operations in the local array C during clock cycles CY8 and CY9, data can be written to one local array 142 successively over two clock cycles. In contrast, as shown in operations in the local array A during clock cycles CY4 to CY7, data cannot be read from one local array 142 successively over two clock cycles. Thus, when read access from the bus 110 to one local array 142 continues over two successive clock cycles, the DOSRAM 120 generates a wait signal for temporarily stopping access to the memory section 112. Next, the generation of the wait signal is described with reference to FIG. 6 and the like.

<<Operation Example of MCU>>

Figure 6:
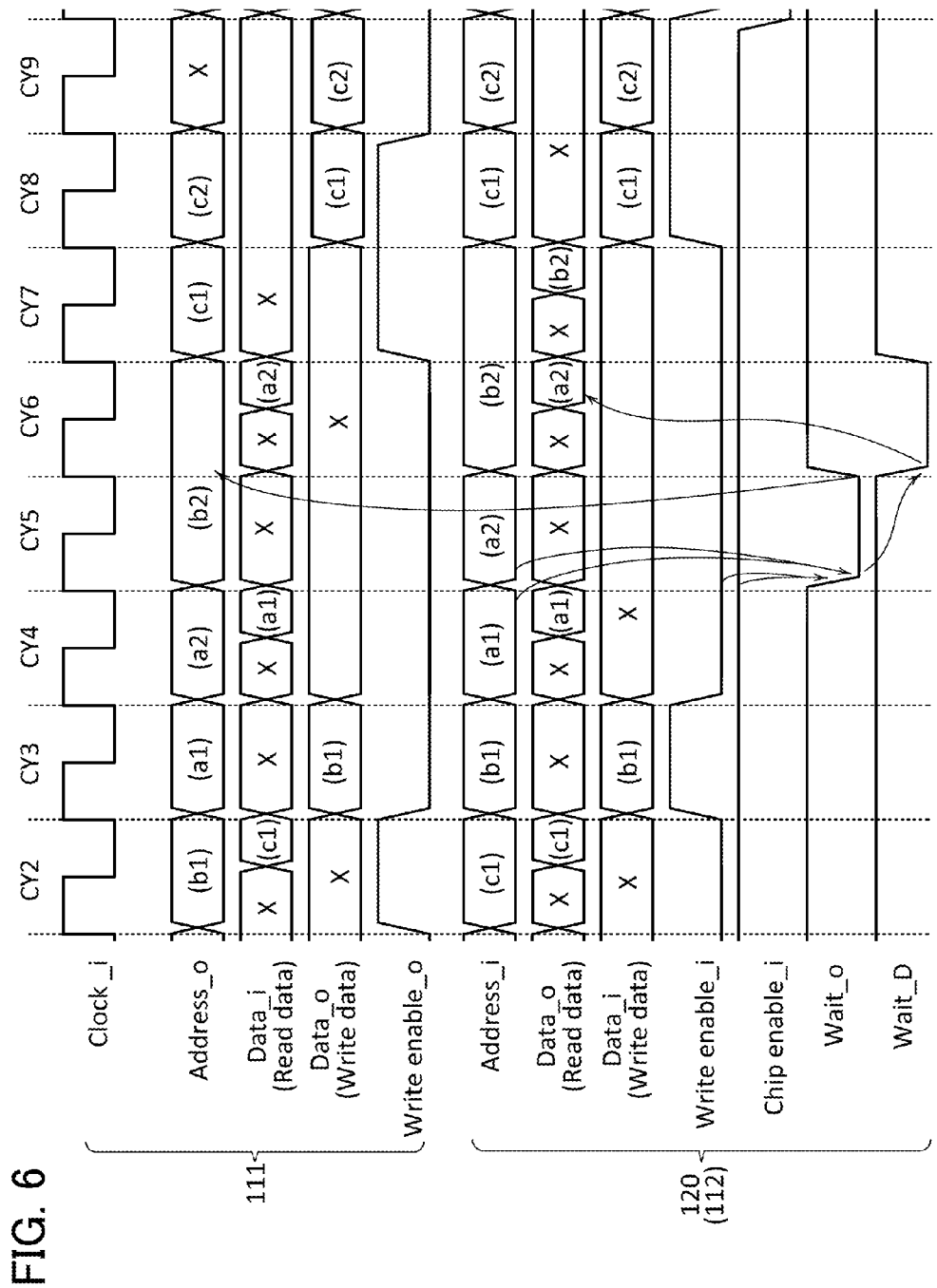
FIG. 6 is a timing chart showing an operation example of an MCU.

FIG. 6 is a timing chart showing an operation example of the MCU 100. FIG. 6 shows an access operation of the core 111 to the memory section 112 during the clock cycles CY2 to CY9 in FIG. 4. For easy understanding of the operation of the MCU 100, arrows are written in the timing chart.

In FIG. 6, "_o" represents an output signal to the bus 110, and "_i" represents an input signal from the bus 110. For example, "Address_o" represents an address signal which the core 111 outputs to the bus 110, and "Address_i" represents an address signal which is input from the bus 110 to the DOSRAM 120. Data which have been read from the memory section 112 are input to the core 111. Data which the core 111 has output are written to the memory section 112. "Wait_D" is an internal signal of DOSRAM 120 and is obtained by delaying a wait signal.

Since FIG. 6 shows the operations during the clock cycles CY2 to CY9, access to the memory section 112 corresponds to access to the DOSRAM 120. Note that (a*), (b*), and (c*) in the timing chart represent signals relating to the local arrays A, B, and C of the DOSRAM 120, respectively. For example, an address (a1) is an address in the local array A. Data (a1) are data stored by the local array A. "X" indicates that the value of the signal is not specified or the signal does not contribute to the operation of the DOSRAM 120.

The core 111 outputs an address signal (b1) and a write enable signal of "H" to the bus 110 in the clock cycle CY2 and outputs data (b1) to the bus 110 in the next clock cycle CY3.

In the clock cycle CY3, the address signal (b1), the data (b1), and the write enable signal of "H" are input from the bus 110 to the DOSRAM 120. In the clock cycle CY3, the DOSRAM 120 writes the data (b1) to an address (b1).

In the clock cycle CY3, the core 111 outputs an address signal (a1) and a write enable signal of "L". In the next clock cycle CY4, the DOSRAM 120 drives the local array A or the like to read the data (a1) from the address (a1). The data (a1)

that have been read are input to the core 111 via the bus 110 in the same clock cycle CY4, where the read operation has been performed.

In the clock cycles CY3 and CY4, the core 111 requests the local array A to execute reading successively.

The core 111 outputs the address signal (a1) and the write enable signal of "L" in the clock cycle CY3 and outputs an address signal (a2) and a write enable signal of "L" in the next clock cycle CY4. The address signal (a1) and a write enable signal of "L", and a chip enable signal of "H" are input to the DOSRAM 120 in the clock cycle CY4, and the address signal (a2), a write enable signal of "L", and a chip enable signal of "H" are input to the DOSRAM 120 in the clock cycle CY5.

In the clock cycle CY4, the DOSRAM 120 reads the data (a1) from the address (a1). The data (a1) that have been read are input to the core 111 via the bus 110 in the clock cycle CY4. In the clock cycle CY5, the DOSRAM 120 drives the local array A and performs a data restoration operation for writing the data (a1) back to the address (a1). Therefore, data (a2) cannot be written to the address (a1) in the clock cycle CY5.

Therefore, in the case where there is reading access which continues over two successive clock cycles and two input address signals are both address signals that specify the same local array 142, the control section 131 of the DOSRAM 120 issues a wait signal. Whether the former condition is satisfied or not can be determined by a logic operation of a chip enable signal and a write enable signal.

A configuration example and an operation example of the control section 131 are described with reference to FIG. 5. The control section 131 includes a register section 150 and a logic section 155. The register section 150 has a function of storing input signals (chip enable signals, address signals, and write enable signals). The register section 150 includes registers 152A, 152B, 153A, 153B, 154A, and 154B.

The registers 152A and 152B are registers for chip enable signals. One of the two registers stores a chip enable signal taken in the current clock cycle, and the other thereof stores a chip enable signal taken in the preceding clock cycle. To achieve such a configuration, for example, the registers 152A and 152B are activated alternately every clock cycle so as to alternately take in a chip enable signal from the bus 110. For another configuration example, the register 152A takes in a chip enable signal from the bus 110 and transfers retained data to the register 152B every clock cycle. The register 152B retains the signal transferred from the register 152A. In the latter configuration example, the register 152A stores a chip enable signal of the current clock cycle, and the register 152B stores a chip enable signal of the preceding clock cycle.

The registers 153A and 153B are registers for write enable signals, and the registers 154A and 154B are registers for address signals. The registers 153A and 153B and the registers 154A and 154B have functions similar to those of the registers 152A and 152B.

The logic section 155 generates a wait signal on the basis of data retained in the register section 150. In this example, the logic section 155 generates a wait signal when data of both the registers 152A and 152B are "1", data of both the registers 152A and 152B are "0", and data of the registers 154A and 154B are addresses which specify the same local array 142. Here, the wait signal is at "L". When the retention data of the register section 150 do not satisfy these conditions, the logic section 155 outputs a wait signal of "H" to the bus 110. In the example of FIG. 6, a wait signal of "L" is output to the bus 110 in the clock cycle CY5, and a wait signal of "H" is output to the bus 110 in the clock cycle CY6.

The logic section 155 generates a delay wait signal (Wait_D). The delay wait signal is used as an internal signal of the control section 131. The control section 131 generates control signals for the row circuit 133 and the column circuit 134 on the basis of a chip enable signal, an address signal, a write enable signal, and a delay wait signal. In the example of FIG. 6, a delay wait signal is a signal which is delayed from a wait signal by one clock cycle.

When the wait signal is at "L", the core 111 stands by (stalls) for issuing access request to the memory section 112. In the clock cycle CY6, since a wait signal at the rising of clock is at "L", the core 111 does not execute a write request to an address (c1) and performs the same processing as in the clock cycle CY5.

When the delay wait signal is at "L", the control section 131 of the DOSRAM 120 generates control signals for the row circuit 133 and the column circuit 134 with the use of the address signal, the chip enable signal, and the write enable signal of the preceding clock cycle, which are stored in the register section 150. Therefore, in the DOSRAM 120, an operation for reading the data (a2) from an address (a2) is performed in the clock cycle CY6, and a restoration operation for writing the data (a2) back to the address (a2) and an operation for reading data (b2) from an address (b2) are performed in the clock cycle CY7.

The core 111 outputs an address signal (c1) and a write enable signal of "H" in the clock cycle CY7 and outputs an address signal (c2) and a write enable signal of "H" in the next clock cycle CY8. In the DOSRAM 120, data (c1) is written to the address (c1) in the clock cycle CY8, and data (c2) is written to an address (c2) in the clock cycle CY9.

There is theoretically no limitation on the number of rewriting operations of the DOSRAM 120 because data is rewritten by charging and discharging of the capacitor CS1; and data can be written/read to/from the DOSRAM 120 with low energy. Owing to a simple circuit configuration of the memory cell 30, the capacity can be easily increased. In addition, the frequency of refresh operations is low. Therefore, by mounting the DOSRAM 120, the low-power MCU 100 including the large-capacity memory section 112 can be provided. However, since the memory cell 30 of the DOSRAM 120 has a simple circuit configuration, the performance of the DOSRAM 120 as a memory module is largely influenced by the electrical characteristics of an OS transistor (the transistor MW1).

An OS transistor has a low on-state current than a Si transistor. This causes a problem in that data writing speed and data reading speed of the DOSRAM 120 are lower than those of a DRAM including a Si transistor. When the DOSRAM 120 performs a pipeline operation, throughput of the DOSRAM 120 can be improved; as a result, the performance of the MCU 100 can be improved.

The number of pipelines of the DOSRAM 120 corresponds to the number of the local arrays 142. The number of memory cells per bit line (Nmc/BL) of the DOSRAM 120 can be smaller than that of a DRAM; therefore, the number of the local arrays 142 of the DOSRAM 120 can be larger than that of a DRAM when the DOSRAM 120 and the DRAM have the same numbers of word lines and bit lines. The reason for the small Nmc/BL of the DOSRAM 120 is because the memory cell 30 of the DOSRAM 120 includes an OS transistor, that is, the local array 142 is formed with a stack of the sense amplifier array 145 and the local cell array 143. In addition, owing to the small Nmc/BL, the length of a bit line can be shortened; as a result, the bit line capacitance can be reduced, and the capacitance of the capacitor CS1 of the memory cell 30 can be reduced. Accordingly, the high-speed DOSRAM 120 can be obtained.

For example, the Nmc/BL of the DOSRAM 120 can be greater than or equal to 2 and less than or equal to 128. The Nmc/BL is preferably $2^x$ (x is preferably an integer of 2 to 7, further preferably an integer of 3 to 6). In terms of high capacitance, bit line throughput, and controllability, a suitable Nmc/BL is 8 ($2^3$), 16 ($2^4$), or 32 ($2^5$). Needless to say, although it is possible to design a DRAM so that the Nmc/BL is 8, 16, or 32, a cost per bit is high; therefore, such a DRAM is not practical as a product. In contrast, the DOSRAM 120 can have a small Nmc/BL while a cost per bit can be reduced.

Exceptional processing is generated in the pipeline operation of the DOSRAM 120 when data are successively read from one local array 142. Therefore, as the number of the local arrays 142 becomes large, the generation rate of exceptional processing can be reduced. Since the Nmc/BL of the DOSRAM 120 can be easily reduced, the generation rate of exceptional processing can be easily reduced by increasing the number of the local arrays 142.

Even when exceptional processing is generated, owing to a wait signal issued by the DOSRAM 120, the number of clock cycles in which the core 111 is in a stall state can be reduced and the processing of the core 111 can be easily resumed during processing which relates to the memory section 112.

As described above, this embodiment of the present invention can be achieved by effective application of the circuit configuration of the DOSRAM. The pipeline operation of the DOSRAM can effectively improve the throughput of the DOSRAM.

Therefore, when the DOSRAM is incorporated in an MCU, it is possible to increase the capacitance of the memory section and reduce the power consumption while keeping the performance of the processor core.

Embodiment 2

More specific configuration and operation examples of a DOSRAM are described in this embodiment.

<<Configuration Example of DOSRAM>>

Figure 8:
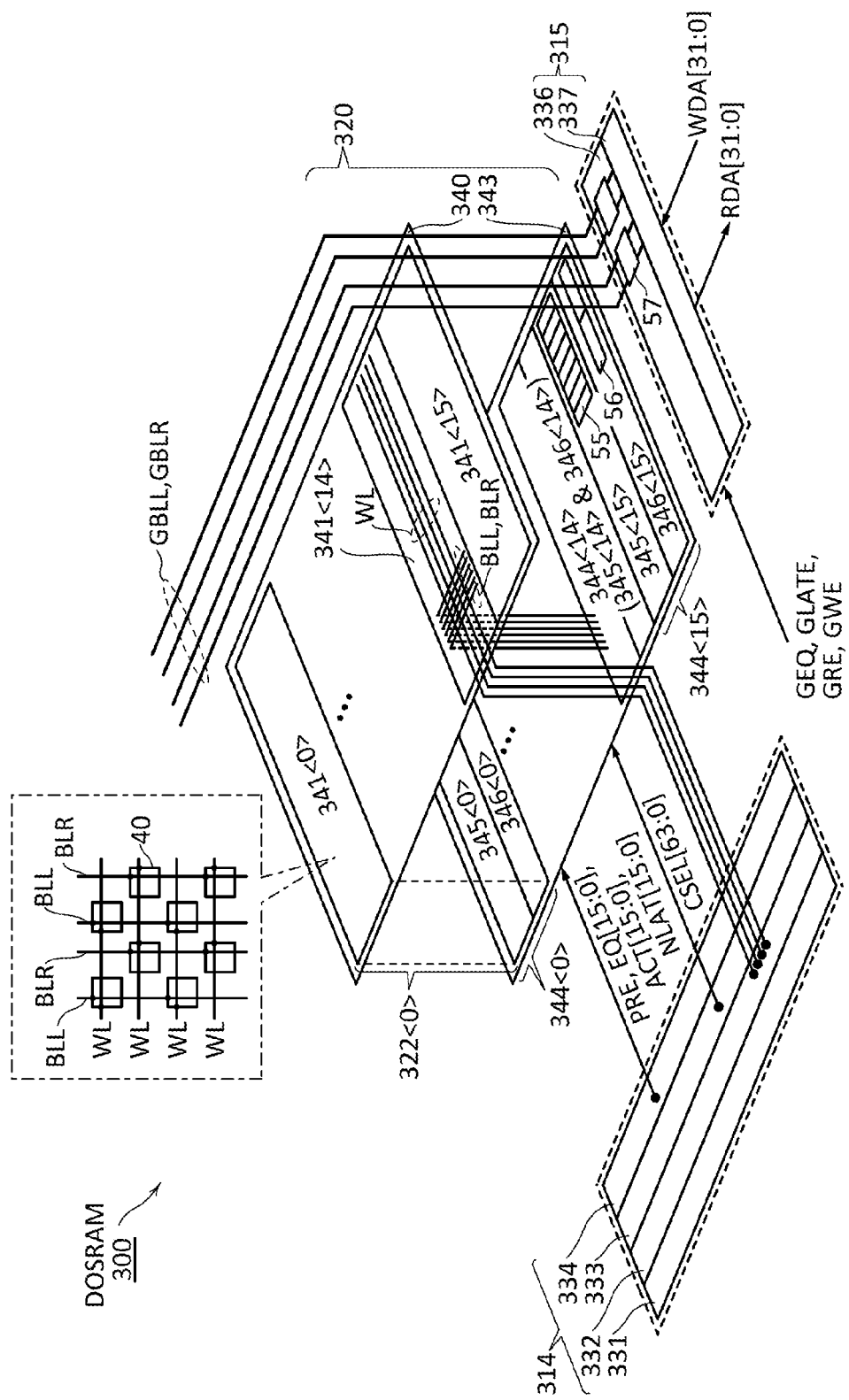
FIG. 8 is a block diagram illustrating a configuration example of a DOSRAM.

FIG. 8 is a block diagram illustrating a configuration example of a DOSRAM.

A DOSRAM 300 includes a control section 310, a row circuit 314, a column circuit 315, and a memory cell block 320. The row circuit 314 includes a decoder 331, a word line driver 332, a column selector 333, and a sense amplifier driver 334. The column circuit 315 includes a global sense amplifier block 336 and an input/output (I/O) circuit 337.

The DOSRAM 300 has a hierarchical bit-line architecture, like the DOSRAM 120. The memory cell block 320 includes a plurality of local arrays 322 and a plurality of global bit lines. The local array 322 includes a plurality of memory cells, a plurality of bit lines, and a plurality of word lines. For easy understanding of the configuration and operation of the DOSRAM 300, the specifications of the DOSRAM 300 are set as follows.

A bit line width of a data signal is 32. The arrangement of the memory cells is folded bit-line arrangement. The number of the local arrays 322 is 16. The numbers of word lines and bit lines in each local array 322 are 8 and 256, respectively, and the number of memory cells for each bit line is 4.

The DOSRAM 300 is supplied with signals CLK, CE, GW, BW[3:0], ADDR[10:2], and data signals WDA[31:0] and outputs a signal WAIT and data signals RDA[31:0]. The signal CLK is a clock signal. The signal CE is a chip enable signal, the signal GW is a write enable signal, the signals BW[3:0] are byte write enable signals, and the signals ADDR[10:2] are address signals. The signal WAIT is a wait signal. The data signals WDA[31:0] are write data signals, and the data signals RDA[31:0] are read data signals.

In the DOSRAM 300, the signal GW corresponds to the write enable signal described in Embodiment 1. The DOSRAM 300 issues the signal WAIT on the basis of the signals CE, GW, and ADDR[10:2].

In the DOSRAM 300, circuits, signals, and voltages are selected and used as appropriate. Another circuit or another signal may further be used. Structures (e.g., bit lengths) of input and output signals to/from the DOSRAM 300 are set on the basis of the operation of the DOSRAM 300, the configuration of the memory cell block 320, and the like.

(Control Section 310)

The control section 310 is a logic circuit having a function of controlling the entire operation of the DOSRAM 300. The control section 310 has a function of generating the signal WAIT on the basis of the signals CE, GW and ADDR[10:2]. Furthermore, the control section 310 has a function of performing a logic operation of the signals CE, GW, and BW[3:0] and determining an operation and a function of generating control signals for the row circuit 314 and the column circuit 315 so that the determined operation is executed.

Figure 7:
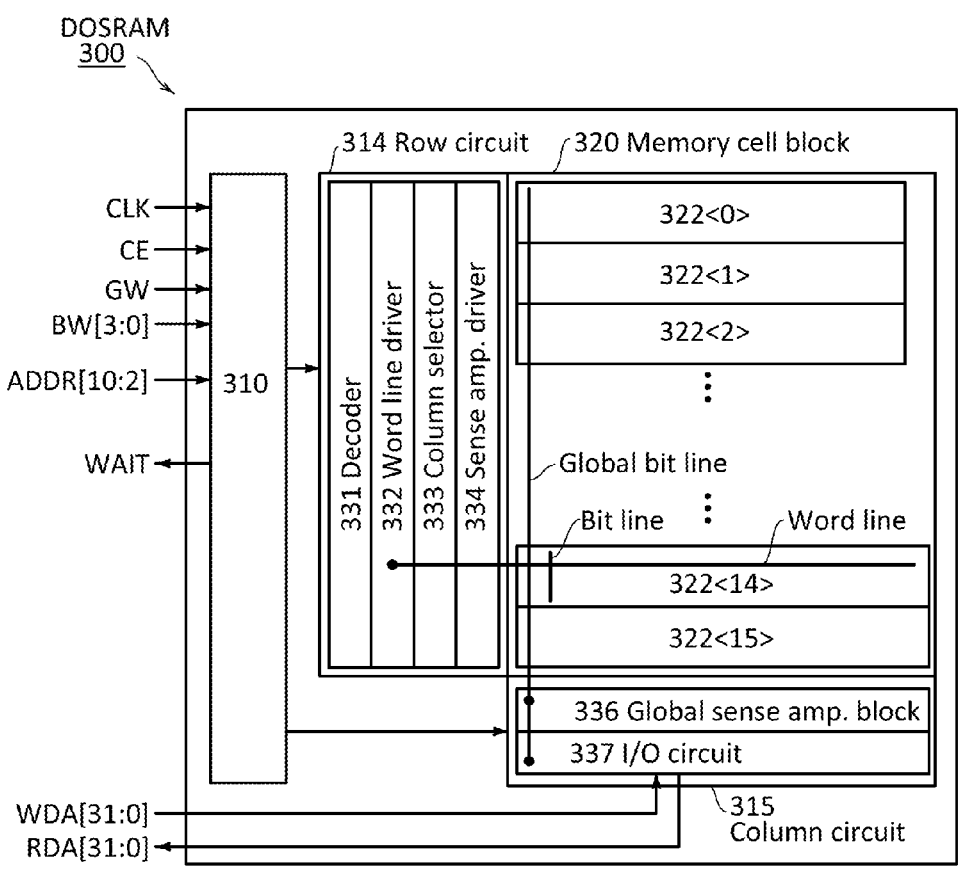
FIG. 7 is a block diagram illustrating a configuration example of a DOSRAM.
Figure 9:
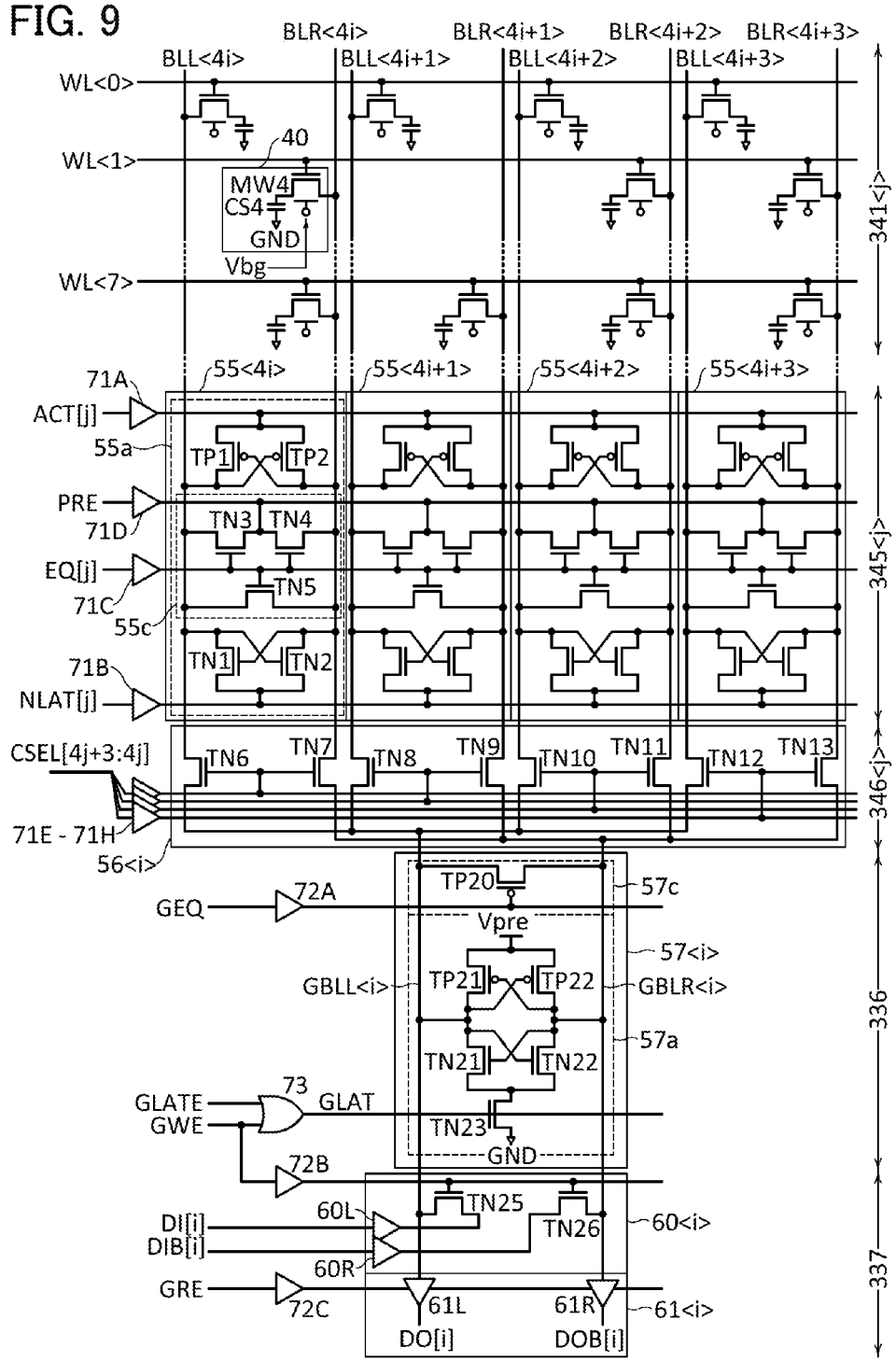
FIG. 9 is a circuit diagram illustrating a configuration example of a memory cell block and a column circuit.

A configuration example of the row circuit 314, the column circuit 315, and the memory cell block 320 is described with reference to FIG. 7, FIG. 8, and FIG. 9. FIG. 7 is a block diagram illustrating the hierarchical bit-line architecture of the DOSRAM 300.

(Memory Cell Block 320)

The memory cell block 320 includes a memory cell array 340, a sense amplifier block 343, 32 global bit lines GBLL, and 32 global bit lines GBLR. The memory cell array 340 is stacked over the sense amplifier block 343, and the global bit lines GBLL and GBLR are stacked over the memory cell array 340.

The memory cell array 340 includes local cell arrays 341<0> to 341<15>. The local cell array 341<j> (j is an integer of 0 to 15) includes 8 word lines WL, 128 bit lines BLL, 128 bit lines BLR, and 256×4 memory cells 40.

The sense amplifier block 343 includes sense amplifier arrays 344<0> to 344<15>. The sense amplifier array 344<j> includes a local sense amplifier array 345<j> and an MUX 346<j>.

The local sense amplifier array 345<j> includes 128 sense amplifiers 55. A sense amplifier 55<h> (h is an integer of 0 to 127) is electrically connected to a bit line pair (BLL<h>, BLR<h>). The sense amplifier 55<h> has a function of amplifying a difference between the potentials of the bit line pair (BLL<h>,BLR<h>) and a function of retaining the potential difference.

The MUX 346<j> includes 32 selectors 56. A global bit line pair (GBLL<i>,GBLR<i>), and four bit line pairs (BLL<4i>,BLR<4i>) to (BLL<4i+3>,BLR<4i+3>) are electrically connected to a selector 56<i> (i is an integer of 0 to 31). The selector 56<i> has a function of selecting one of the four bit line pairs (BLL<4i>,BLR<4i>) to (BLL<4i+3>, BLR<4i+3>) and establishing electrical continuity between the selected bit line pair (BLL,BLR) and the global bit line pair (GBLL<i>,GBLR<i>).

(Row Circuit 314)

The row circuit 314 has a function of driving the memory cell block 320. Specifically, the row circuit 314 has a function of selecting a memory cell which is to be accessed, a function of driving a sense amplifier, and a function of controlling input and output of data signals between the column circuit 315 and the memory cell block 320.

The decoder 331 has a function of decoding the signals ADDR[10:2]. The word line driver 332, the column selector 333, and the sense amplifier driver 334 generate signals on the basis of signals from the control section 310 and the decoder 331.

The word line driver 332 has a function of generating a selection signal for selecting a word line WL of a row which is to be accessed.

The column selector 333 is a circuit for driving MUXs 346<0> to 346<15> and generates signals CSEL[63:0]. The signals CSEL[63:0] have a function of selecting a bit line pair (BLL,BLR) of a column which is to be accessed. The signals CSEL[63:0] are output to the sense amplifier block 343.

The sense amplifier driver 334 is a circuit for driving local sense amplifier arrays 345<0> to 345<15>. The sense amplifier driver 334 generates signals PRE, EQ[15:0], ACT[15:0], and NLAT[15:0]. These signals are output to the sense amplifier block 343.

(Column Circuit 315)

The column circuit 315 has a function of controlling input of the data signals WDA[31:0] and a function of controlling output of the data signals RDA[31:0]. Signals GEQ, GLATE, GRE, and GWE are input from the control section 310 to the column circuit 315.

The global sense amplifier block 336 includes 32 global sense amplifiers 57. A global sense amplifier 57<i> is electrically connected to the global bit line pair (GBLL<i>, GBLR<i>). The global sense amplifier 57<i> has a function of amplifying a difference between the potentials of the global bit line pair (GBLL<i>,GBLR<i>) and a function of retaining the potential difference. The input/output circuit 337 writes and reads data to and from the global bit lines GBLL<i> and GBLR<i>.

The input/output circuit 337 has a function of generating 32-bit complementary data signals from the data signals WDA[31:0], a function of writing the 32-bit complementary data signals to the 32 global bit line pairs (GBLL,GBLR), a function of reading the 32-bit complementary data signals from the 32 global bit line pairs (GBLL,GBLR), and a function of generating the data signals RDA[31:0] from the read 32-bit complementary data signals. Here, the 32-bit complementary data signals written to the 32 global bit line pairs (GBLL,GBLR) are referred to as data signals DI[31:0] and DIB[31:0], and the 32-bit complementary data signals read from the 32 global bit line pairs (GBLL,GBLR) are referred to as data signals DO[31:0] and DOB[31:0].

A circuit configuration example of the memory cell block 320 and the column circuit 315 is described with reference to FIG. 9. FIG. 9 illustrates circuits serving as constituent units of a local array 322<j> and the column circuit 315.

(Local Cell Array 341)

A constituent unit of the local cell array 341<j> includes eight word lines WL<0> to WL<7>, four bit line pairs (BLL<4i>,BLR<4i>) to (BLL<4i+3>,BLR<4i+3>), and 64 (8×8) memory cells 40. The memory cell 40 has a circuit configuration similar to that of the memory cell 31 and includes a transistor MW4 and a capacitor CS4. A back gate of the transistor MW4 is electrically connected to a wiring for supplying a potential Vbg. A terminal of the capacitor CS4 is electrically connected to a wiring for supplying a ground potential (hereinafter referred to as a potential GND).

(Local Sense Amplifier Array 345)

Signals ACT[j], NLAT[j], EQ[j], and PRE are input to the local sense amplifier array 345<j> via buffers 71A to 71D. Sense amplifiers 55<4i> to 55<4i+3> are provided in the local sense amplifier array 345<j> with respect to the four bit line pairs (BLL<4i>,BLR<4i>) to (BLL<4i+3>,BLR<4i+3>).

The sense amplifier 55<4i> includes transistors TN1 to TN5, a transistor TP1, and a transistor TP2. The transistors TN1, TN2, TP1, and TP2 form a latch sense amplifier (hereinafter, referred to as a sense amplifier 55a). The difference between the potentials of the bit line pair (BLL<4i>,BLR<4i>) is amplified and retained by the sense amplifier 55a. The signals ACT[j] and NLAT[j] are signals for supplying a power supply potential to the sense amplifier 55a.

The transistors TN3 to TN5 form an equalizer 55c. The signal EQ and the signal PRE are input to the equalizer 55c via the buffer 71C and the buffer 71D, respectively. The equalizer 55c has a function of smoothing the potential of the bit line pair (BLL<4i>,BLR<4i>) and a function of precharging the bit line pair (BLL<4i>,BLR<4i>). The signal EQ is a control signal for smoothing and precharging, and the signal PRE is a signal for supplying a precharge potential to the bit line pair(BLL,BLR).

The sense amplifiers 55<4i+1> to 55<4i+3> each have a circuit configuration similar to that of the sense amplifier 55<4i> and have a function similar to that of the sense amplifier 55<4i>.

(MUX 346)

Signals CSEL[4j+3:4j] are input to the MUX 346<j> via buffers 71E to 71H. The MUX 346<j> includes selectors 56<0> to 56<31>. The selector 56<i> is electrically connected to the four bit line pairs (BLL<4i>,BLR<4i>) to (BLL<4i+3>,BLR<4i+3>) and the one global bit line pair (GBLL<i>,GBLR<i>).

The selector 56<i> is a pass transistor logic circuit including transistors TN6 to TN13. The signal CSEL[4j] is input to the transistors TN6 and TN7, the signal CSEL[4j+1] is input to the transistors TN8 and TN9, the signal CSEL[4j+2] is input to the transistors TN10 and TN11, and the signal CSEL[4j+3] is input to the transistors TN12 and TN13.

The selector 56<i> has a function of establishing electrical continuity between one of the four bit line pairs and the global bit line pair (GBLL<i>,GBLR<i>) on the basis of the signals CSEL[4j+3:4 j].

(Global Sense Amplifier Block 336)

The signal GEQ is input to the global sense amplifier block 336 via a buffer 72A, and the signals GLATE and GWE are input to the global sense amplifier block 336 via an OR circuit 73. Here, an output signal of the OR circuit 73 is referred to as a signal GLAT. The global sense amplifier 57<i> is electrically connected to the global bit line pair (GBLL<i>,GBLR<i>). The global sense amplifier 57<1> includes a sense amplifier 57a and an equalizer 57c.

The equalizer 57c includes a transistor TP20. The equalizer 55c has a function of smoothing the potentials of the global bit line pair (GBLL<i>,GBLR<i>). The signal GEQ is a control signal for the equalizer 57c.

The sense amplifier 57a includes transistors TN21 to TN23, a transistor TP21, and a transistor TP22. The sense amplifier 57a is electrically connected to a wiring for supplying a potential Vpre and a wiring for supplying the potential GND. The transistor TN23 functions as a power switch which controls supply of the potential GND. The signal GLAT is a signal for activating the sense amplifier 57a.

(Input/Output Circuit 337)

The signal GWE and the signal GRE are input to the input/output circuit 337 via a buffer 72B and a buffer 72C, respectively. The signal GWE has a function of controlling writing of the data signals DI[31:0] and DIB[31:0] to the 32 global bit line pairs (GBLL,GBLR). The signal GRE has a function of controlling reading of the data signals DO[31:0] and DOB[31:0] from the 32 global bit line pairs (GBLL, GBLR).

An input buffer 60<i> and an output buffer 61<i> are provided in the input/output circuit 337. The input buffer 60<i> includes transistors TN25 and TN26, and buffers 60L and 60R. The input buffer 60<i> has a function of inputting data signals DI[i] and DIB[i] to the global bit lines GBLL<i> and GBLR<i> in response to the signal GWE. The output buffer 61<i> includes buffers 61L and 61R. The output buffer 61<i> has a function of outputting the potentials of the global bit lines GBLL<i> and GBLR<i> as data signals DO[i] and DOB[i] in response to the signal GRE.

(Another Configuration Example of Local Cell Array)

Figure 12:
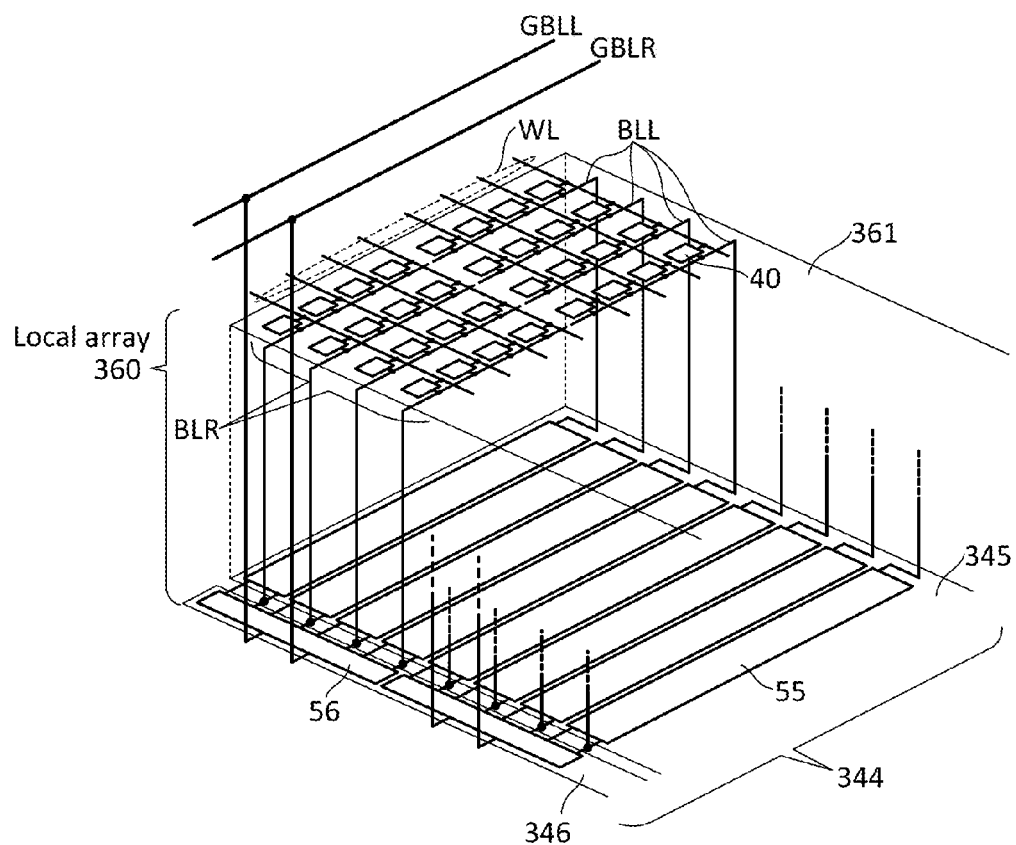
FIG. 12 is a block diagram illustrating a configuration example of a local array.

Although the arrangement of the memory cells of the DOSRAM 300 is a folded bit-line arrangement, an open bit-line arrangement can be employed. A configuration example of an open bit-line local array is illustrated in FIG. 12. A local array 360 illustrated in FIG. 12 includes a sense amplifier array 344 and a local cell array 361. The local cell array 361 is stacked over the sense amplifier array 344. Similarly to the local cell array 341, the local cell array 361 includes 8 word lines WL and 128 bit line pairs (BLL,BLR), and the number of memory cells for each bit line is 4.

<<Operation Example of DOSRAM>>

The control section 310 performs a logical operation on the signals CE, GW, and BW[3:0] to determine the operation of the DOSRAM 300. Table 1 shows a truth table for setting the operation of the DOSRAM 300. The DOSRAM 300 has the following operations: standby, read, write (byte write, half-word write, and word write), and refresh. Note that the bit width of one word is 32 bits.

TABLE 1

| Operation | CE | GW | BW[0] | BW[1] | BW[2] | BW[3] |
|---|---|---|---|---|---|---|
| Standby | L | X | X | X | X | X |
| Read | H | L | L | L | L | L |
| Byte write | H | H | H | L | L | L |
| Half-word write | H | H | H | H | L | L |
| Word write | H | H | H | H | H | H |
| Refresh | H | H | L | L | L | L |

Figure 10:
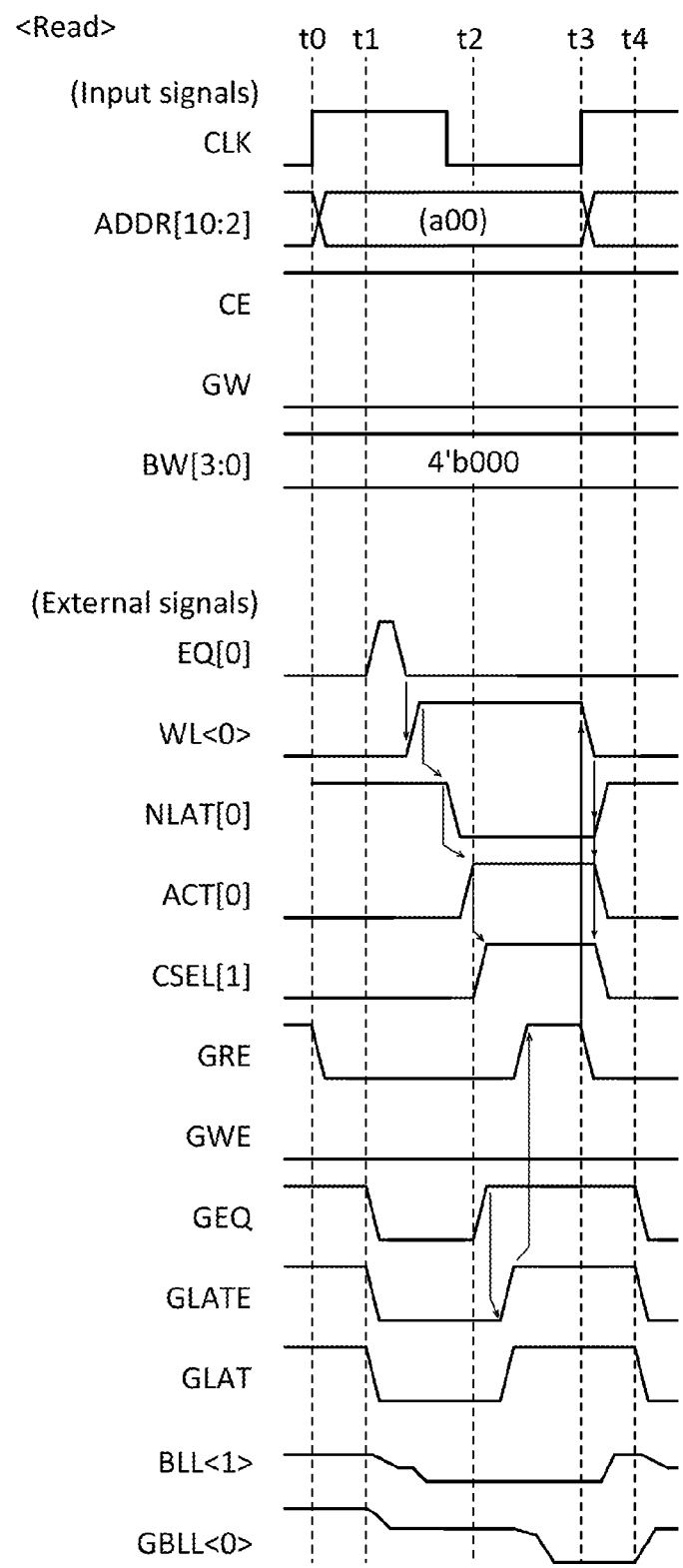
FIG. 10 is a timing chart showing an example of a read operation of a DOSRAM.
Figure 11:
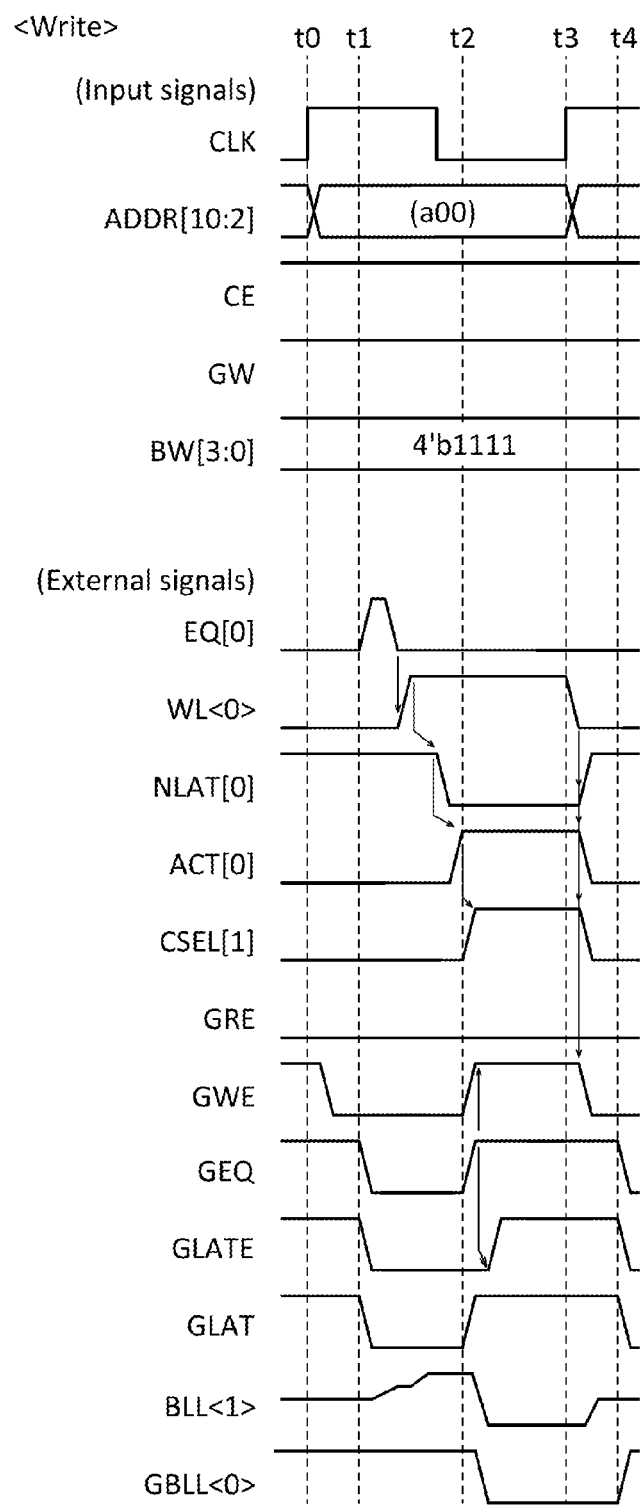
FIG. 11 is a timing chart showing an example of a write operation of a DOSRAM.

Next, an operation example of the DOSRAM 300 is described with reference to timing charts shown in FIG. 10 and FIG. 11. FIG. 10 and FIG. 11 show a read operation and a write operation for a local array 322<0>. Typically, operations for reading and writing data from and to the memory cell 40 electrically connected to the word line WL<0> and the bit line BLL<1> (hereinafter referred to as a memory cell 40<0,1>) are described. In FIG. 10 and FIG. 11, t0 and the like each indicate time. An address (a00) is an address which specifies the local array 322<0>.

<Reading>

In the read operation, the signal CE is 1'b1, the signal GW is 1'b0, and the signals BW[3:0] are 4'b0000 (see Table 1).

At time t0, the signal NLAT[0] is at "H" and the signal ACT[0] is at "L"; therefore, the local sense amplifier 345<0> is not active.

At time t1, the signals GEQ and GLATE are changed from "H" to "L"; thus, the potentials of the 32 global bit line pairs (GBLL,GBLR) are smoothed in the global sense amplifier block 336.

In addition, the signal EQ[0] is changed from "L" to "H" at the time t1. When the signal EQ[0] of "H" is input, the local sense amplifier array 345<0> precharges all the bit line pairs (BLL,BLR) of the local cell array 341<0> and smooths the potentials. Here, as the signal PRE, the potential Vpre is input to the local sense amplifier array 345<0>. The signal EQ is turned into "L", whereby precharging of the bit line pairs (BLL,BLR) is completed.

Next, a row from which data are to be read is selected. Here, a signal of "H" is input to only the word line WL<0> of the local cell array 341<0>. Data retained in the 128 memory cells 40 electrically connected to the word line WL<0> are written to the bit lines BLL<0> to BLL<127>. Here, the memory cell 40<0,1> stores data "0". Therefore, the word line WL<0> is set at "H", whereby the potential of the bit line BLL<1> decreases.

Next, the signal NLAT[0] is set at "L" and the signal ACT[0] is set at "H" to activate the local sense amplifier array 345<0>. Owing to a sense amplifier 55<1>, the potential of the bit line BLL<1> is set at "L" and the potential of a bit line BLR<1> is set at "H".

Next, the MUX 346<0> establishes electrical continuity between the 32 global bit line pairs (GBLL,GBLR) and the 32 bit line pairs (BLL, BLR) of columns from which data are to be read. Signals CSEL[0] to CSEL[3] are input to the MUX 346<0>.

Among them, only the signal CSEL[1] is changed from "L" to "H" at time t2. Accordingly, electrical continuity between the bit line pair (BLL<4i+1>,BLR<4i+1>) and the global bit line pair (GBLL<i>,GBLR<i>) is established.

In conjunction with the operation of the MUX 346<0>, the global sense amplifier block 336 is activated. First, the signal GEQ is set at "H" at the time t2 to complete smoothing of the potentials of the 32 global bit line pairs (GBLL,GBLR). Next, the signal GLATE is set at "H" to activate the global sense amplifier block 336. Owing to a global sense amplifier 57<0>, GBLL<0> and GBLR<0> are set at "L" and "H", respectively.

In a period in which the signal GLATE is at "H", the signal GRE of "H" is input to the input/output circuit 337. Output buffers 61<0> to 61<31> output the potentials of the 32 global bit lines GBLL and the potentials of global 32 bit lines GBLR as the data signals DO[31:0] and the data signals DOB[31:0], respectively.

In conjunction with setting the signal GRE at "L", the word line WL<0> of the local cell array 341<0> is brought into a non-selected state. After that, the signal CSEL[1] is set at "L", the signal NLAT[0] is set at "H", and the signal ACT[0] is set at "L". Thus, electrical continuity between the 32 global bit line pairs (GBLL,GBLR) and the 32 bit line pairs (BLL, BLR) of the columns from which data are to be read is not established, so that the sense amplifier array 344<0> is deactivated.

In this manner, the read operation of the local array 322<0> is completed. In the next clock cycle, a restoration operation of the local array 322<0> is executed. During the clock cycle in which the restoration operation is executed in the local array 322<0>, a read or write operation of one of the local arrays 322<1> to 322<15> is possible. Also in this clock cycle, when access to the local array 322<0> is requested, the control section 310 generates the signal WAIT.

<Writing>

An operation of writing data "0" to the memory cell 40<0,1> is described with reference to FIG. 11. In the write operation, the signal CE is 1'b1, the signal GW is 1'b1, and the signals BW[3:0] are 4'b1111 (see Table 1).

Operations from time t0 to time t2 are similar to those in the read operation. A difference from the read operation is that the signal GWE is changed from "L" to "H" at the time t2. When the signal GWE is set at "H", the data signals DI[31:0] and DIB[31:0] are written to the 32 global bit line pairs (GBLL,GBLR). In addition, the signal GLAT is set at "H"; thus, the differences between potentials of the 32 global bit line pairs (GBLL,GBLR) are amplified by the global sense amplifier block 336. Here, data "0" is written to the global bit line GBLL<0>. Accordingly, the potential of the global bit line GBLL<0> decreases at the time t2 to "L". In conjunction with this, the potential of the bit line BLL<1> also decreases to be "L". During a period in which the signal GWE is at "H", the word line WL<0> is in a selected state, and thus, data "0" is written to the memory cell 40<0,1>.

Operations from time t3 to t4 are similar to those in the read operation. A difference from the read operation is that the signal GWE is set at "L" after the word line WL<0> is brought into a non-selected state. Thus, the write operation is completed.

Embodiment 3

In this embodiment, an IC chip, an electronic component, an electronic device, and the like are described as examples of a semiconductor device.

<Example of Manufacturing Method of Electronic Component>

Figure 13A:
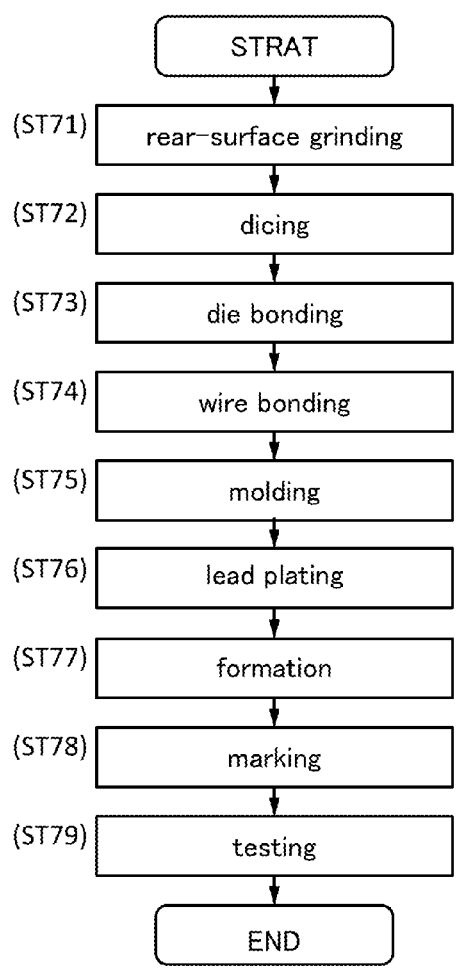
FIG. 13A is a flow chart showing an example of a method for manufacturing an electronic component.

FIG. 13A is a flow chart showing an example of a method for manufacturing an electronic component. The electronic component is also referred to as a semiconductor package or an IC package. The electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be finished through the steps in FIG. 13A. In a pre-process, first, a semiconductor device of one embodiment of the present invention and the like are provided on a semiconductor wafer (e.g., a silicon wafer).

Figure 13B:
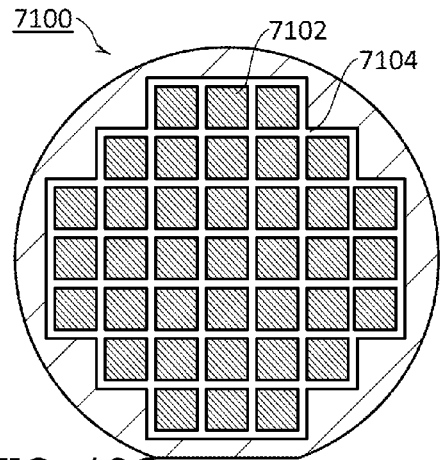
FIG. 13B is a top view of a semiconductor wafer.
Figure 13C:
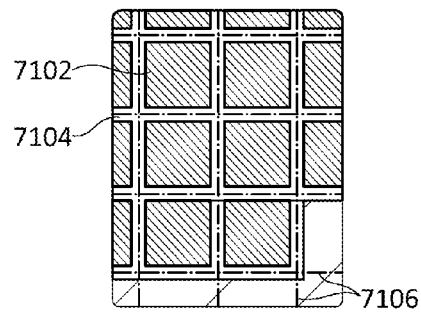
FIG. 13C is a partial enlarged view of the semiconductor wafer.

In a post-process, first, a rear-surface grinding step in which a rear surface of the semiconductor wafer (a surface on which a semiconductor device and the like are not formed) is ground is performed (Step ST71). When the semiconductor wafer is thinned by grinding, the size of the electronic component can be reduced. FIG. 13B is a top view illustrating an example of the semiconductor wafer after being subjected to Step ST71. FIG. 13C is a partial enlarged view of FIG. 13B. A plurality of circuit regions 7102 is provided over the semiconductor wafer 7100 illustrated in FIG. 13B. A semiconductor device of one embodiment of the present invention (e.g., the MCU or the storage device) is provided in each circuit region 7102. After Step ST71, a dicing step of dividing the semiconductor wafer into a plurality of chips is performed (Step ST72).

Figure 13D:
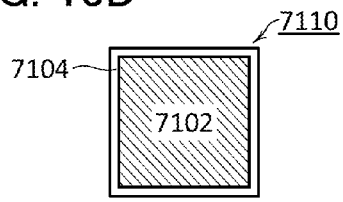
FIG. 13D is an enlarged view illustrating a structure example of a chip.

The circuit regions 7102 are each surrounded by a separation region 7104. Separation lines (also referred to as "dicing lines") 7106 are set at a position overlapping with the separation regions 7104. In the dicing step, the semiconductor wafer 7100 is cut along the separation lines 7106, whereby chips 7110 including the circuit regions 7102 are cut out from the semiconductor wafer 7100. FIG. 13D is an enlarged view of the chip 7110.

Next, a die bonding step in which the divided chips 7110 are separately picked up and bonded on a lead frame is performed (Step ST73). In the die bonding step, the chip 7110 may be bonded to the lead frame by an appropriate method depending on the product, for example, with a resin or a tape. The chip 7110 may be bonded to an interposer substrate instead of the lead frame.

Next, a wire bonding step of electrically connecting a lead of the lead frame and an electrode on the chip 7110 with a metal wire is performed (Step ST74). As the metal wire, a silver wire, a gold wire, or the like can be used. For wire bonding, ball bonding or wedge bonding can be employed, for example. The wire-bonded chip 7110 is subjected to a molding step of sealing the chip with an epoxy resin or the like (Step ST75).

Subsequently, the lead of the lead frame is plated in a lead plating step (Step ST76). Then, the lead is cut and processed into a predetermined shape in a formation step (Step ST77). A printing (marking) step is performed on a surface of the package (Step ST78). After a testing step (Step ST79) for checking whether an external shape is good and whether there is a malfunction, for example, the electronic component is completed.

Figure 13E:
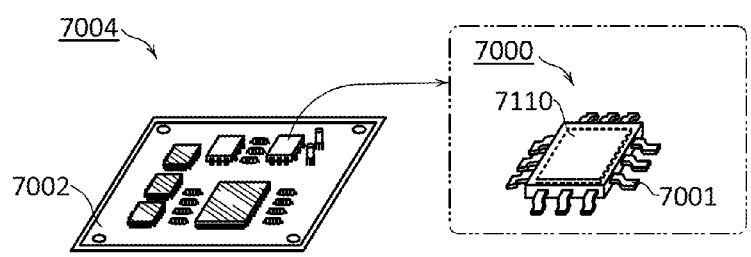
FIG. 13E is a schematic view illustrating a structure example of the electronic component.

FIG. 13E is a schematic perspective view of a completed electronic component. FIG. 13E illustrates a schematic perspective view of a quad flat package (QFP) as an example of the electronic component. As illustrated in FIG. 13E, an electronic component 7000 includes a lead 7001 and a chip 7110. The electronic component 7000 may include a plurality of chips 7110.

The electronic component 7000 is mounted on a printed circuit board 7002, for example. A plurality of electronic components 7000 are combined and electrically connected to each other over the printed circuit board 7002; thus, a circuit board on which the electronic components are mounted (a circuit board 7004) is completed. The circuit board 7004 is provided in an electronic device or the like.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Structure examples of electronic devices are described with reference to FIGS. 14A to 14F. Note that a touch panel device including a touch sensor is preferably used for display portions of the electronic devices in FIG. 14A and the like. With the touch panel device, the display portion can also function as an input portion of the electronic device.

Figure 14A:
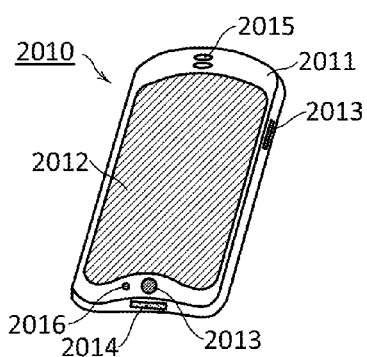
FIGS. 14A to 14F illustrate structure examples of an electronic device.

An information terminal 2010 illustrated in FIG. 14A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various kinds of operation such as making a call, inputting letters, and switching screen images on the display portion 2012 can be performed by touching the display portion 2012 with a finger or the like. The information terminal 2010 can be operated by inputting sound from the microphone 2016. Moreover, a variety of operations such as power on/off operation and screen switching of the display portion 2012 can be performed by pressing the operation button 2013.

Figure 14B:
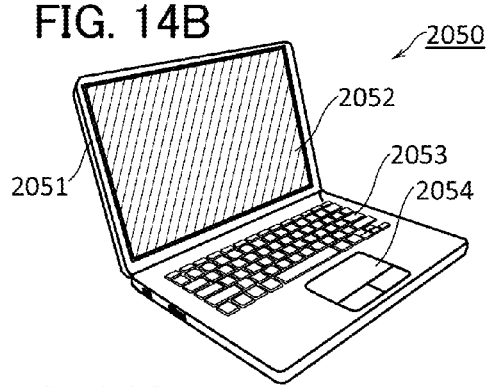

A laptop personal computer (PC) 2050 in FIG. 14B includes a housing 2051, a display portion 2052, a keyboard 2053, and a pointing device 2054. The laptop PC 2050 can be operated by touch operation on the display portion 2052.

Figure 14C:
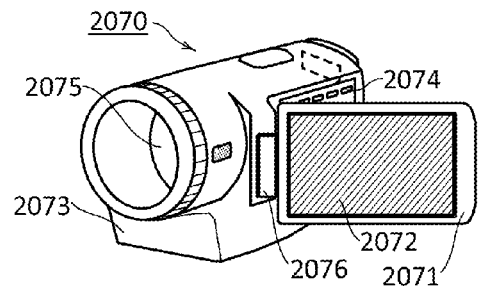

A video camera 2070 in FIG. 14C includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. A variety of operations such as start and stop of recording, zoom adjustment, and change of shooting range can be executed by touch operation on the display portion 2072.

Figure 14D:
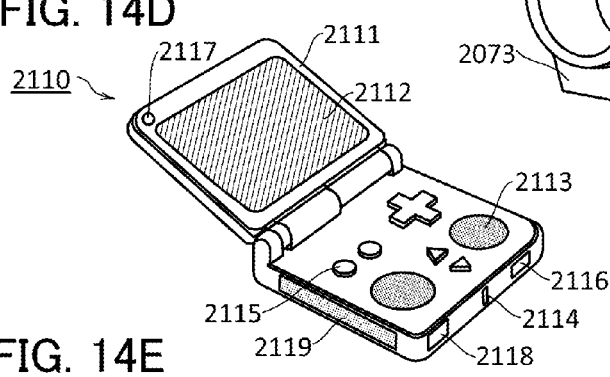

A portable game console 2110 in FIG. 14D includes a housing 2111, a display portion 2112, speakers 2113, an LED lamp 2114, operation key buttons 2115, a connection terminal 2116, a camera 2117, a microphone 2118, and a recording medium read portion 2119.

Figure 14E:
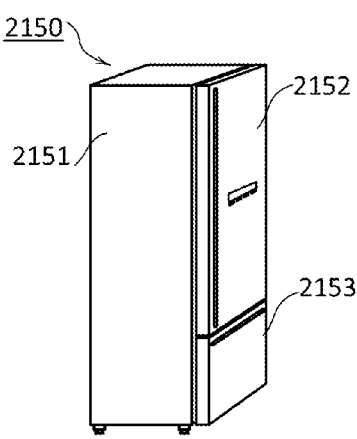

An electric refrigerator-freezer 2150 in FIG. 14E includes a housing 2151, a refrigerator door 2152, a freezer door 2153, and the like.

Figure 14F:
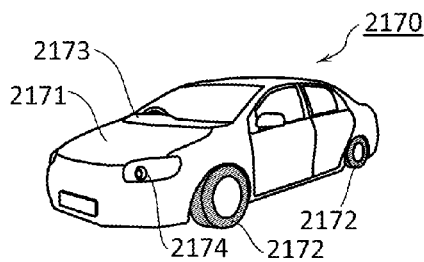

A motor vehicle 2170 in FIG. 14F includes a car body 2171, wheels 2172, a dashboard 2173, lights 2174, and the like. The MCU in Embodiment 1 is used in each of processors in the motor vehicle 2170.

Embodiment 4

In this embodiment, an oxide semiconductor transistor is described.
<<Structure Example 1 of OS Transistor>>
FIG. 15A is a top view illustrating a structure example of an OS transistor. FIG. 15B is a cross-sectional view taken along line X1-X2 in FIG. 15A. FIG. 15C is a cross-sectional view taken along line Y1-Y2 in FIG. 15A. In some cases, the direction of line X1-X2 is referred to as a channel length direction, and the direction of line Y1-Y2 is referred to as a channel width direction. Accordingly, FIG. 15B illustrates a cross-sectional structure of the OS transistor in the channel length direction, and FIG. 15C illustrates a cross-sectional structure of the OS transistor in the channel width direction. Note that to clarify the device structure, FIG. 15A does not illustrate some components.

An OS transistor 501 is formed over an insulating surface, here, over an insulating layer 521. The OS transistor 501 is covered with insulating layers 528 and 529. The OS transistor 501 includes insulating layers 522 to 527, an insulator 530, metal oxide layers 511 to 513, and conductive layers 550 to 553.

Note that an insulating layer, a metal oxide layer, a conductor, and the like in a drawing may have a single-layer structure or a stacked-layer structure. These layers can be formed by any of a variety of deposition methods such as a sputtering method, a molecular beam epitaxy (MBE) method, a pulsed laser deposition (PLD) method, a CVD method, and an atomic layer deposition (ALD) method. Examples of a CVD method include a plasma CVD method, a thermal CVD method, and a metal organic CVD method.

The metal oxide layers 511 to 513 are collectively referred to as an oxide layer 510. As illustrated in FIGS. 15B and 15C, the oxide layer 510 includes a portion where the metal oxide layer 511, the metal oxide layer 512, and the metal oxide layer 513 are stacked in that order. When the OS transistor 501 is on, a channel is mainly formed in the metal oxide layer 512 of the oxide layer 510.

A gate electrode of the OS transistor 501 is formed using the conductive layer 550. A pair of electrodes that functions as a source electrode and a drain electrode of the OS transistor 501 is formed using the conductive layers 551 and 552. A back gate electrode of the OS transistor 501 is formed using the conductive layer 553. The conductive layer 553 includes conductive layers 553a and 553b. Note that the OS transistor 501 does not necessarily include a back gate electrode. The same applies to an OS transistor 502 to be described later.

A gate insulating layer on a gate (front gate) side is formed using the insulating layer 527. A gate insulating layer on a back gate side is formed using a stack of the insulating layers 524 to 526. The insulating layer 528 is an interlayer insulating layer. The insulating layer 529 is a barrier layer.

The metal oxide layer 513 covers a stack of the metal oxide layers 511 and 512 and the conductive layers 551 and 552. The insulating layer 527 covers the metal oxide layer 513. The conductive layers 551 and 552 each include a region that overlaps with the conductive layer 550 with the metal oxide layer 513 and the insulating layer 527 positioned therebetween.

Examples of a conductive material used for the conductive layers 550 to 553 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 550 is a single layer of tantalum nitride or tungsten. Alternatively, in the case where the conductive layer 550 has a two-layer structure or a three-layer structure, the following combinations can be used: aluminum and titanium; titanium nitride and titanium;

titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor written first is used for a layer on the insulating layer 527 side.

The conductive layers 551 and 552 have the same layer structure. For example, in the case where the conductive layer 551 is a single layer, any of metals such as aluminum, titanium, chromium, nickel, copper, yttrium, zirconium, molybdenum, silver, tantalum, and tungsten, or an alloy containing any of these metals as its main component may be included. Alternatively, in the case where the conductive layer 551 has a two-layer structure or a three-layer structure layer, the following combinations can be used: titanium and aluminum; tungsten and aluminum; tungsten and copper; a copper-magnesium-aluminum alloy and copper; titanium and copper; titanium or titanium nitride, aluminum or copper, and titanium or titanium nitride; and molybdenum or molybdenum nitride, aluminum or copper, and molybdenum or molybdenum nitride. The conductor written first is used for a layer on the insulating layer 527 side.

For example, it is preferable that the conductive layer 553a be a conductive layer that has a hydrogen barrier property (e.g., a tantalum nitride layer) and that the conductive layer 553b be a conductive layer that has higher conductivity than the conductive layer 553a (e.g., a tungsten layer). With such a structure, the conductive layer 553 functions as a wiring and has a function of preventing diffusion of hydrogen into the oxide layer 510.

Examples of insulating materials used for the insulating layers 521 to 530 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 521 to 530 are formed using a single-layer structure or a stacked-layer structure of these insulating materials. The layers used for the insulating layers 521 to 530 may include a plurality of insulating materials.

Note that in this specification and the like, an oxynitride refers to a compound that contains more oxygen than nitrogen, and a nitride oxide refers to a compound that contains more nitrogen than oxygen.

In order to suppress the increase in oxygen vacancies in the oxide layer 510, the insulating layers 526 to 528 preferably include oxygen. Further preferably, at least one of the insulating layers 526 to 528 is formed using an insulating film from which oxygen is released by heating (hereinafter such an insulating film is referred to as an insulating film containing excess oxygen). When oxygen is supplied from the insulating film containing excess oxygen to the oxide layer 510, the oxygen vacancies in the oxide layer 510 can be compensated. Thus, reliability and electrical characteristics of the OS transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ molecules/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 521 to 529 is preferably low in order to prevent the increase in the concentration of hydrogen in the oxide layer 510. In particular, the concentration of hydrogen in the insulating layers 523 to 528 is preferably low. Specifically, the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

The concentration of nitrogen in the insulating layers 523 to 528 is preferably low in order to prevent the increase in the concentration of nitrogen in the oxide layer 510. Specifically, the concentration of nitrogen is lower than $5 \times 10^{19}$ atoms/cm$^3$, preferably lower than or equal to $1 \times 10^{18}$ atoms/cm$^3$, further preferably lower than or equal to $5 \times 10^{17}$ atoms/cm$^3$.

The hydrogen concentration and the nitrogen concentration are measured by secondary ion mass spectrometry (SIMS).

In the OS transistor 501, the oxide layer 510 is preferably surrounded by an insulating layer with oxygen and hydrogen barrier properties (hereinafter such an insulating layer is referred to as a barrier layer). With such a structure, it is possible to suppress the release of oxygen from the oxide layer 510 and entry of hydrogen into the oxide layer 510; thus, the reliability and electrical characteristics of the OS transistor 501 can be improved.

For example, the insulating layer 529 functions as a barrier layer and at least one of the insulating layers 521, 522, and 524 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. In addition, a barrier layer may be provided between the oxide layer 510 and the conductive layer 550. Alternatively, a metal oxide layer that has oxygen and hydrogen barrier properties may be provided as the metal oxide layer 513.

The insulating layer 530 is preferably a barrier layer prevents oxidation of the conductive layer 550. When the insulating layer 530 has a barrier property against oxygen, oxygen released from the insulating layer 528 or the like can be prevented from oxidizing the conductive layer 550. For example, a metal oxide such as aluminum oxide can be used for the insulating layer 530.

A structure example of the insulating layers 521 to 530 is described. In this example, each of the insulating layers 521, 522, 525, 529, and 530 functions as a barrier layer. The insulating layers 526 to 528 are oxide layers containing excess oxygen. The insulating layer 521 is formed using silicon nitride. The insulating layer 522 is formed using aluminum oxide. The insulating layer 523 is formed using silicon oxynitride. The gate insulating layers (524 to 526) on the back gate side are formed using a stack of silicon oxide, aluminum oxide, and silicon oxide. The gate insulating layer (527) on the front gate side is formed using silicon oxynitride. The interlayer insulating layer (528) is formed using silicon oxide. The insulating layers 529 and 530 are formed using aluminum oxide.

(Metal Oxide Layer)

The thickness of each of the metal oxide layers 511 to 513 is larger than or equal to 3 nm and smaller than or equal to 500 nm, preferably larger than or equal to 3 nm and smaller than or equal to 100 nm, further preferably larger than or equal to 3 nm and smaller than or equal to 60 nm.

In order to reduce the off-state current of the OS transistor 501, for example, the energy gap of the metal oxide layer 512 is preferably large. The energy gap of the metal oxide layer 512 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 510 is preferably a crystalline metal oxide layer, where at least the metal oxide layer 512 is preferably a crystalline metal oxide layer. The OS transistor 501 can have high reliability and favorable electrical characteristics.

As the oxide of the metal oxide layer 512, typically, an In—Ga oxide, an In—Zn oxide, or an In—M—Zn oxide (M is Al, Ga, Y, or Sn) can be used. The metal oxide layer 512 is not limited to the oxide layer containing indium. The metal oxide layer 512 can be formed using a Zn—Sn oxide, a Ga—Sn oxide, or a Zn—Mg oxide, for example. The metal oxide layers 511 and 513 can be formed using an oxide that is similar to the oxide of the metal oxide layer 512. The metal oxide layers 511 and 513 can be formed using a Ga oxide. In that case, the metal oxide layer 512 is preferably a metal oxide layer containing Ga.

When an interface level is formed at an interface between the metal oxide layer 512 and the metal oxide layer 511, a channel region is also formed in a region close to the interface; thus, the threshold voltage of the OS transistor 501 varies. It is preferable that the metal oxide layer 511 contain at least one of the metal elements contained in the metal oxide layer 512. Accordingly, an interface state is hardly formed at the interface between the metal oxide layer 512 and the metal oxide layer 511, and variations in the electrical characteristics of the OS transistor 501, such as the threshold voltage, can be reduced.

The metal oxide layer 513 preferably contains at least one of the metal elements contained in the metal oxide layer 512 because interface scattering is unlikely to occur at the interface between the metal oxide layer 512 and the metal oxide layer 513, and carrier transfer is not inhibited. Thus, the field-effect mobility of the OS transistor 501 can be increased.

It is preferable that the metal oxide layer 512 have the highest carrier mobility among the metal oxide layers 511 to 513. Accordingly, a channel can be formed in the metal oxide layer 512 that is apart from the insulating layers 526 and 527.

For example, in a metal oxide containing In such as an In—M—Zn oxide, carrier mobility can be increased by an increase in the In content. In the In—M—Zn oxide, the s orbital of heavy metal mainly contributes to carrier transfer, and when the indium content is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

For example, the metal oxide layer 512 is formed using an In—Ga—Zn oxide, and the metal oxide layers 511 and 513 are formed using a Ga oxide. For example, in the case where the metal oxide layers 511 to 513 are formed using an In—M—Zn oxide, the metal oxide layer 511 is formed to have the highest In content among the metal oxide layers 511 to 513. In the case where the In—M—Zn oxide is formed by a sputtering method, the In content can be changed by a change in the atomic ratio of metal elements of a target.

For example, it is preferable that the atomic ratio of metal elements of a target used for depositing the metal oxide layer 512 be In:M:Zn=1:1:1, 3:1:2, or 4:2:4.1. For example, it is preferable that the atomic ratio of metal elements of a target used for depositing the metal oxide layers 511 and 513 be In:M:Zn=1:3:2 or 1:3:4. The atomic ratio of an In—M—Zn oxide deposited using a target of In:M:Zn=4:2:4.1 is approximately In:M:Zn=4:2:3.

In order that the OS transistor 501 have stable electrical characteristics, it is preferable to reduce the concentration of impurities in the oxide layer 510. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration in the electric characteristics of the transistor.

FIGS. 15A to 15C illustrate examples in which the oxide layer 510 has a three-layer structure; however, one embodiment of the present invention is not limited thereto. For example, the oxide layer 510 may have a two-layer structure without the metal oxide layer 511 or 513 or may be composed of one of the metal oxide layers 511 and 512. Alternatively, the metal oxide layer 510 may be composed of four or more metal oxide layers.

<<Structure Example 2 of OS Transistor>>

Figure 16A:
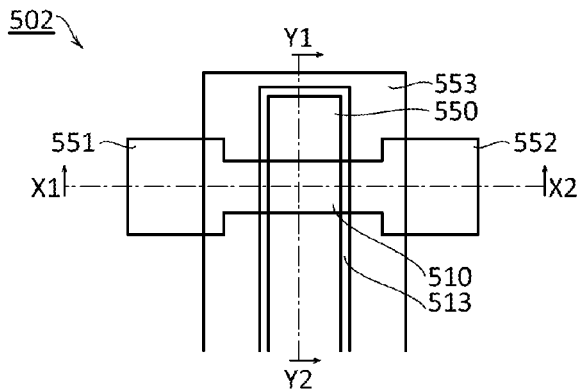
FIG. 16A is a plan view illustrating a structure example of an oxide semiconductor transistor.
Figure 16B:
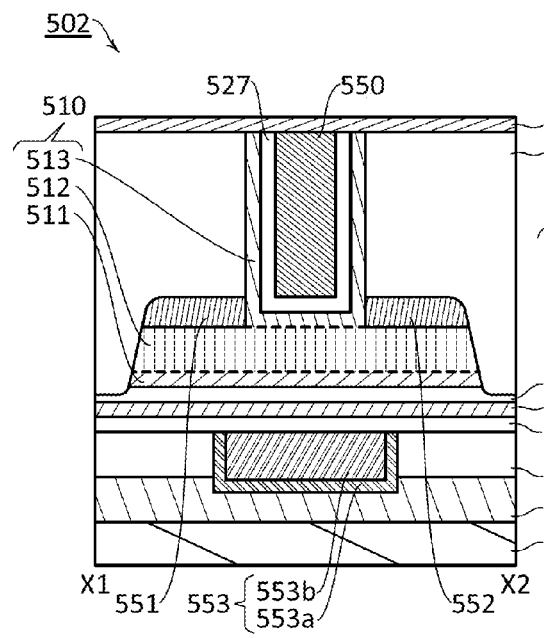
FIGS. 16B and 16C are cross-sectional views of FIG. 16A.
Figure 16C:
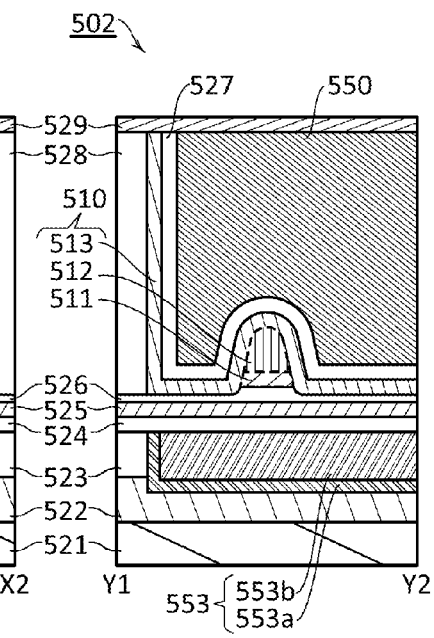

The OS transistor 502 in FIGS. 16A to 16C is a modification example of the OS transistor 501. The OS transistor 502 differs from the OS transistor 501 mainly in the structure of the gate electrode.

The metal oxide layer 513, the insulating layer 527, and the conductive layer 550 are provided in an opening portion formed in the insulating layer 528. In other words, a gate electrode is formed in a self-aligned manner by using the opening portion of the insulating layer 528. Thus, in the OS transistor 502, a gate electrode (550) does not include a region that overlaps with a source electrode or a drain electrode (551 or 552) with a gate insulating layer (527) positioned therebetween. Accordingly, gate-source parasitic capacitance and gate-drain parasitic capacitance can be reduced and frequency characteristics can be improved. Furthermore, the gate electrode width can be controlled by the opening portion of the insulating layer 528; thus, it is easy to fabricate an OS transistor with a short channel length.

<<Structure Example of Semiconductor Device>>

A structure example of a semiconductor device including an OS transistor and a Si transistor is described with reference to FIG. 17.

Figure 17:
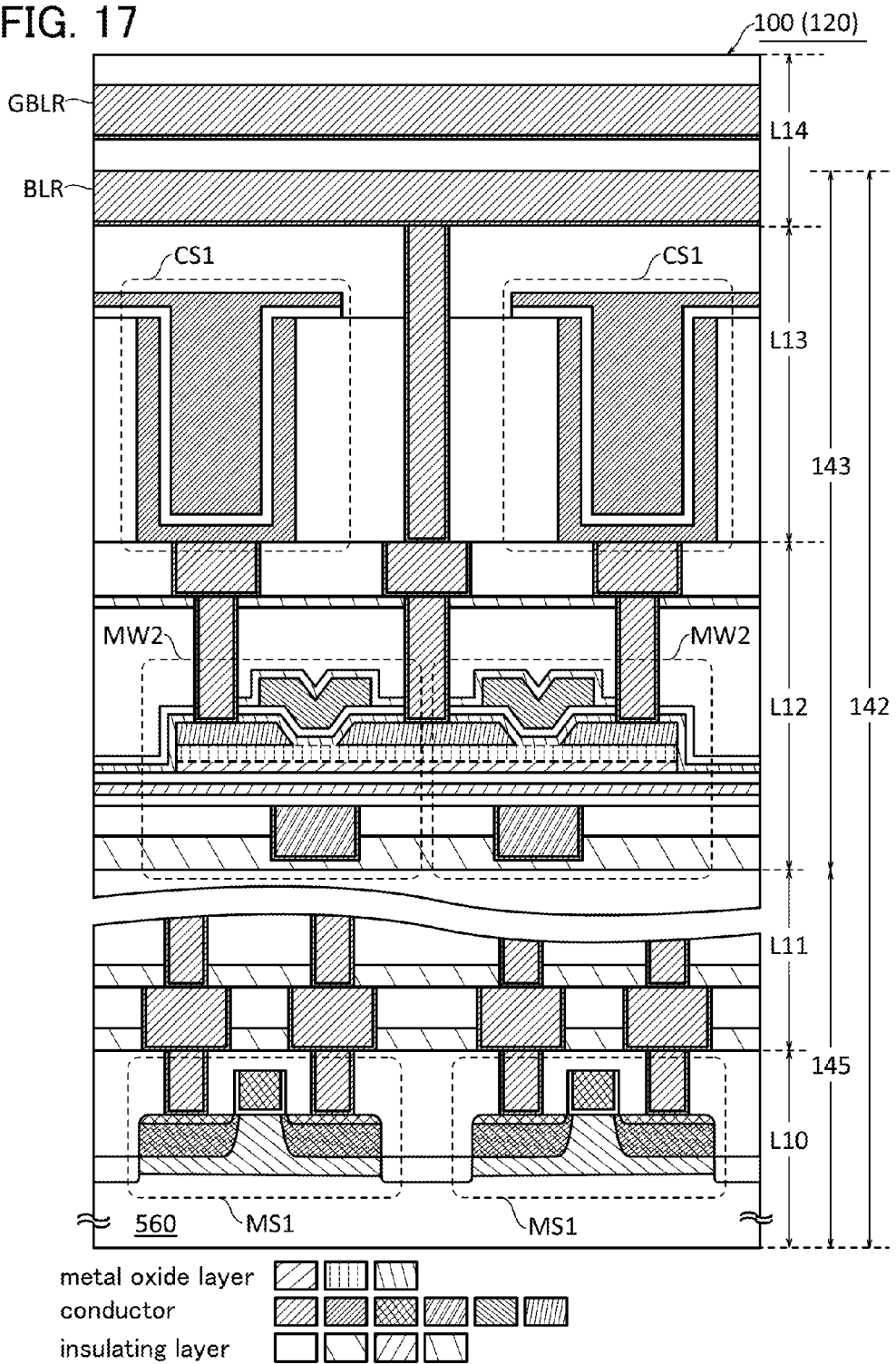
FIG. 17 is a cross-sectional view illustrating a structure example of an MCU.

FIG. 17 is a cross-sectional view illustrating the stacked-layer structure of the MCU 100 (FIG. 1). A main part of the DOSRAM 120 (specifically, a main part of the local array 142) mounted on the MCU 100 is illustrated in FIG. 17.

The MCU 100 includes stacked layers L10 to L14. The sense amplifier array 145 of the DOSRAM 120 is provided in the layers L10 and L11, and the local cell array 143 is provided in the layers L12 to L14. Here, the memory cell 31 (FIG. 2C) is provided in the local array 142.

Si transistors included in the MCU 100 are provided in the layer L10. The layer L10 includes wirings, plugs, and the like. Active layers of the Si transistors are formed using a single crystal silicon wafer 560. Transistors MS1 illustrated in FIG. 17 are transistors of the sense amplifier array 145. The layer L11 includes wirings, plugs, and the like. The sense amplifier array 145 and the like are provided in the stacked layers L10 and L11.

OS transistors, wirings (e.g., a word line), plugs, and the like are provided in the layer L12. The structures of transistors MW2 illustrated in FIG. 17 are similar to the structure of the OS transistor 501 (FIGS. 16A to 16C). The layer L13 is a capacitor layer in which a storage capacitor (the capacitor CS1) of the DOSRAM 120 is provided. A plug for electrically connecting the capacitor CS1 and transistor MW2, and the like are also provided in the layer L13. Wirings (e.g., the bit lines BLL and BLR and global bit lines GBLL and GBLR), plugs, and the like are provided in the layer L14.

This application is based on Japanese Patent Application serial no. 2016-101535 filed with Japan Patent Office on May 20, 2016, the entire contents of which are hereby incorporated by reference.

What is claimed is:

1. A semiconductor device comprising:
a processor core;
a memory section; and
a bus,
wherein a signal and data are transmitted between the processor core and the memory section via the bus,
wherein the memory section comprises a first memory,
wherein the first memory comprises first to $M_0$th local arrays,
wherein $M_0$ is an integer of more than 1,
wherein a jth local array comprises a jth sense amplifier array and a jth local cell array,
wherein j is an integer of 1 to $M_0$,
the jth local cell array is provided over the jth sense amplifier array,
wherein the jth local cell array comprises first to $(M_1 \times N)$th bit line pairs and a plurality of memory cells,
wherein $M_1$ and N are each an integer of 1 or more,
wherein one of the plurality of memory cells is electrically connected to any one bit line of the first to $(M_1 \times N)$th bit line pairs,
wherein each of the plurality of memory cells comprises a capacitor and a transistor,
wherein the transistor controls charging and discharging of the capacitor,
wherein the jth sense amplifier array comprises first to $(M_1 \times N)$th sense amplifiers,
wherein a hth bit line pair is electrically connected to an hth sense amplifier,
wherein h is an integer of 1 to $M_1 \times N$,
wherein the first memory is configured to generate a wait signal when the first memory receives a request for writing data to the jth local array over two successive clock cycles from the processor core, and
wherein the processor core is configured to stand by for a request for the memory section on the basis of the wait signal.

2. The semiconductor device according to claim 1, wherein the first memory is configured to drive the first to $M_0$th local arrays on the basis of the wait signal.

3. The semiconductor device according to claim 1, wherein the number of the plurality of memory cells for each bit line in the jth local cell array is $2^x$, and
wherein x is an integer of 2 to 7.

4. The semiconductor device according to claim 1, wherein a channel formation region of the transistor comprises an oxide semiconductor.

5. The semiconductor device according to claim 1,
wherein the first memory comprises first to $M_1$th global bit line pairs, first to $M_1$th global sense amplifiers, and a multiplexer,
wherein an ith global bit line pair is electrically connected to an ith global sense amplifier,
wherein i is an integer of 1 to $M_1$, and
wherein the multiplexer is configured to select $M_1$ bit line pairs from the first to $(M_1 \times N)$th bit line pairs and to establish electrical continuity between the selected $M_1$ bit line pairs and the first to $M_1$th global bit line pairs.

6. The semiconductor device according to claim 5, wherein the first to $M_1$th global bit line pairs are provided over the first to $M_0$th local arrays.

7. The semiconductor device according to claim 1, wherein the memory section comprises at least one of an SRAM, a flash memory, an ferroelectric RAM, a magnetoresistive RAM, a resistance RAM, and a phase change RAM.

8. An electronic component comprising:
a chip; and
a lead,
wherein the lead is electrically connected to the chip, and
wherein the semiconductor device according to claim 1 is provided in the chip.

9. An electronic device comprising:
the electronic component according to claim 8; and
at least one of a display portion, a touch sensor, a microphone, a speaker, an operation key, and a housing.

10. A semiconductor device comprising:
a processor core;
a memory section; and
a bus,
wherein a signal and data are transmitted between the processor core and the memory section via the bus,
wherein the memory section comprises a first memory,
wherein the first memory comprises first to $M_0$th local arrays,
wherein $M_0$ is an integer of more than 1,
wherein a jth local array comprises a jth sense amplifier array and a jth local cell array,
wherein j is an integer of 1 to $M_0$,
the jth local cell array is provided over the jth sense amplifier array,
wherein the jth local cell array comprises first to $(M_1 \times N)$th bit line pairs and a plurality of memory cells,
wherein $M_1$ and N are each an integer of 1 or more,
wherein the plurality of memory cells comprise a first memory cell and a second memory cell,
wherein the first memory cell and the second memory cell are electrically connected to the jth sense amplifier array through one of the first to $(M_1 \times N)$th bit line pairs,
wherein each of the plurality of memory cells comprises a capacitor and a transistor,
wherein the transistor controls charging and discharging of the capacitor,
wherein the jth sense amplifier array comprises first to $(M_1 \times N)$th sense amplifiers,
wherein a hth bit line pair is electrically connected to an hth sense amplifier,
wherein h is an integer of 1 to $M_1 \times N$,
wherein the first memory is configured to generate a wait signal when the first memory receives a request for writing data to the jth local array over two successive clock cycles from the processor core, and wherein the processor core is configured to stand by for a request for the memory section on the basis of the wait signal.

11. The semiconductor device according to claim 10, wherein the first memory is configured to drive the first to $M_0$th local arrays on the basis of the wait signal.

12. The semiconductor device according to claim 10, wherein the number of the plurality of memory cells for each bit line in the jth local cell array is $2^x$, and wherein x is an integer of 2 to 7.

13. The semiconductor device according to claim 10, wherein a channel formation region of the transistor comprises an oxide semiconductor.

14. The semiconductor device according to claim 10, wherein the first memory comprises first to $M_1$th global bit line pairs, first to $M_1$th global sense amplifiers, and a multiplexer, wherein an ith global bit line pair is electrically connected to an ith global sense amplifier, wherein i is an integer of 1 to $M_1$, and wherein the multiplexer is configured to select $M_1$ bit line pairs from the first to $(M_1 \times N)$th bit line pairs and to establish electrical continuity between the selected $M_1$ bit line pairs and the first to $M_1$th global bit line pairs.

15. The semiconductor device according to claim 14, wherein the first to $M_1$th global bit line pairs are provided over the first to $M_0$th local arrays.

16. The semiconductor device according to claim 10, wherein the memory section comprises at least one of an SRAM, a flash memory, an ferroelectric RAM, a magnetoresistive RAM, a resistance RAM, and a phase change RAM.

17. An electronic component comprising:
a chip; and
a lead,
wherein the lead is electrically connected to the chip, and
wherein the semiconductor device according to claim 10 is provided in the chip.

18. An electronic device comprising:
the electronic component according to claim 17; and
at least one of a display portion, a touch sensor, a microphone, a speaker, an operation key, and a housing.

* * * * *

UNITED STATES PATENT AND TRADEMARK OFFICE
CERTIFICATE OF CORRECTION

PATENT NO. : 10,037,294 B2  
APPLICATION NO. : 15/590406  
DATED : July 31, 2018  
INVENTOR(S) : Tatsuya Onuki and Wataru Uesugi Page 1 of 1

It is certified that error appears in the above-identified patent and that said Letters Patent is hereby corrected as shown below:

In the Specification

Column 2, Line 30, replace "Moth" with --M$_0$th--;

Column 2, Line 48, replace "Moth" with --M$_0$th--;

Column 8, Line 51, replace "35<j>" with --35<j>--;

Column 16, Line 54, replace "57<1>" with --57<i>--;

In the Claims

Column 27, Line 31, in Claim 1, replace "Moth" with --M$_0$th--; and

Column 28, Line 41, in Claim 10, replace "Moth" with --M$_0$th--.

Signed and Sealed this  
Sixth Day of November, 2018

Andrei Iancu  
*Director of the United States Patent and Trademark Office*